(12) United States Patent  
Tsuchi et al.

(10) Patent No.: US 7,554,389 B2  
(45) Date of Patent: Jun. 30, 2009

(54) DIFFERENTIAL AMPLIFIER AND DIGITAL-TO-ANALOG CONVERTER

(75) Inventors: Hiroshi Tsuchi, Tokyo (JP); Masao Iriguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 67 days.

(21) Appl. No.: 11/657,208

(22) Filed: Jan. 24, 2007

(65) Prior Publication Data

US 2007/0176675 A1 Aug. 2, 2007

(30) Foreign Application Priority Data

Feb. 2, 2006 (JP) .............................. 2006-025631

(51) Int. Cl.
*H03F 1/02* (2006.01)
*H03F 3/45* (2006.01)

(52) U.S. Cl. .......................................... 330/9; 330/253

(58) Field of Classification Search ...................... 330/9  
See application file for complete search history.

(56) References Cited

U.S. PATENT DOCUMENTS

| | | | |
|---|---|---|---|
| 6,448,836 B2 | 9/2002 | Kokubun et al. | ............. 327/307 |
| 7,253,679 B2 * | 8/2007 | Nishimori | ........................ 330/9 |
| 7,368,990 B2 * | 5/2008 | Tsuchi | ......................... 330/261 |

FOREIGN PATENT DOCUMENTS

JP 2001-292041 A 10/2001

* cited by examiner

*Primary Examiner*—Steven J Mottola  
(74) *Attorney, Agent, or Firm*—Scully, Scott, Murphy & Presser, P.C.

(57) ABSTRACT

A differential amplifier comprises first, second, and third input terminals (1, 2, and 3), output terminal (4), first and second differential pairs (531 and 532) (533 and 534) driven by a corresponding current source and having output pairs commonly connected to load circuits (537 and 538), and an amplifier stage (539) having input end connected to at least one of the common connection points of the load circuits and output pairs of the first and second differential pairs and output end connected to output terminal. Input pair of second differential pair receives a signal from third input terminal and a feedback signal from output terminal. First and second switches (SW1 and SW2) are provided between the input pair of the first differential pair and the first and second input terminals (1 and 2), and first and second capacitors (C1 and C2) connected between each connection point of the input pair of the first differential pair and the first and second switches (SW1 and SW2) and a reference voltage terminal are provided. The first, second and third input terminals (1, 2, and 3) may be combined into one terminal to which voltages are serially supplied. It avoids the influence of power supply/signal noise and switch noise, and provides operational output from a plurality of input reference voltages.

20 Claims, 19 Drawing Sheets

| LEVEL | V(T1) | V(T2) | V(T0) | D1,D0 |
|---|---|---|---|---|
| Vo4 | Vb | Va | V n+1 | 1,1 |
| Vo3 | Va | Vb | V n+1 | 1,0 |
| Vo2 | Vb | Va | V n | 0,1 |
| Vo1 | Va | Vb | V n | 0,0 |

Von=V(T0) + {V(T1) −V(T2)}

| LEVEL | V(T1) | V(T2) | V(T0) | D1,D0 |
|---|---|---|---|---|
| Vo4 | V n+1 | V n | V n+1 | 1,1 |
| Vo3 | V n+1 | V n | V n | 1,0 |
| Vo2 | V n | V n+1 | V n+1 | 0,1 |
| Vo1 | V n | V n+1 | V n | 0,0 |

Von=V (T0) + {V (T1) −V (T2)}

| LEVEL | V (T1) =V (T0) | V (T2) | D1, D0 |
|---|---|---|---|
| Vo4 | V n+1 | V n | 1, 1 |
| Vo3 | V n+1 | V n+1 | 1, 0 |
| Vo2 | V n | V n | 0, 1 |
| Vo1 | V n | V n+1 | 0, 0 |

Von=V (T0) + (V (T1) −V (T2))

$V_{out} = V(T0) + \{V(T1) - V(T2)\}$

DIFFERENTIAL AMPLIFIER AND DIGITAL-TO-ANALOG CONVERTER

FIELD OF THE INVENTION

The present invention relates to a differential amplifier and a digital-to-analog converter, and particularly to a differential amplifier, a digital-to-analog converter, and a data driver comprising the digital-to-analog converter suitable for use as a driver for a display device.

BACKGROUND OF THE INVENTION

In recent years, liquid crystal displays (LCD), characterized by their thinness, light-weightiness, and low power consumption, have been widely spread, and used for displays of mobile devices such as mobile phones, cellular phones, PDAs (personal digital assistants), and notebook computers. However, as technologies to enlarge screens of liquid crystal displays and support moving pictures advance, liquid crystal displays are used for not only mobile devices, but also stationary large-screen display devices and large-screen LCD televisions. As such liquid crystal display devices, active matrix LCD devices allowing high definition display are currently in use. First, referring to FIG. 17, a typical configuration of an active matrix LCD device will be described. Note that a main structure connected to a pixel of the liquid crystal display unit is schematically shown by an equivalent circuit diagram in FIG. 17.

The display unit 960 of the active matrix LCD device has generally a structure comprising a semiconductor substrate on which transparent pixel electrodes 964 and thin film transistors (TFT) 963 are disposed in matrix (for instance 1280×3 pixel columns×1024 pixel rows in the case of a color SXGA panel), a counter-substrate having a transparent electrode 966 on the entire surface, and a liquid crystal sealed between the two substrates.

The TFTs 963, having a switching function, are on/off controlled by a scanning signal, such that, when the TFTs 963 are turned on, a grayscale voltage corresponding to a picture data signal is applied to the pixel electrodes 964 and the transmittance of the liquid crystal is changed by the potential difference between each pixel electrode 964 and the electrode 966 of the counter-substrate. Even after the TFTs 963 are turned off, a picture is displayed by having a liquid crystal capacitor 965 maintain this potential difference for a predetermined time.

On the semiconductor substrate, a lattice-like interconnection (wiring) of data lines 962 for sending a plurality of level voltages (grayscale voltages) applied to each pixel electrode 964 and scanning lines 961 for sending the scanning signals are formed (in the case of the aforementioned color SXGA panel, 1280×3 data lines and 1024 scanning lines). The scanning lines 961 and the data lines 962 provide a large capacitive load due to the capacitance generated at the intersections with each other and the capacitance of the liquid crystal interposed between the electrode of the counter-substrate and these lines.

Meanwhile, the scanning signals are supplied from a gate driver 970 to scanning lines 961, and the grayscale voltages are supplied to respective pixel electrodes 964 by a data driver 980 via the data lines 962. Further, the gate driver 970 and the data driver 980 are controlled by a display controller 950. A clock CLK, control signals, and power supply voltages needed are supplied by the display controller 950, and image data is supplied to the data driver 980. Currently, the image data is mainly digital data.

Data for one frame is rewritten every frame period (1/60 second) and is selected successively per scanning line from one row of pixels to the next (every line). The grayscale voltages are supplied from respective data lines during the selection period.

Further, whereas it is sufficient for the gate driver 970 to supply at least two-valued scanning signals, the data driver 980 is required to drive the data lines with grayscale voltages of multi-valued levels corresponding to the number of grayscale levels. Therefore, the data driver 980 comprises a decoder that converts the image data into grayscale voltages and a digital-to-analog converter circuit (DAC) composed of an operational amplifier that amplifies the grayscale voltages and outputs them to the data lines 962.

Further, the recent trend in the liquid crystal display devices is to demand higher picture quality (with an increasing number of colors), and at least 260,000 colors (6-bit image data for each of RGB), or sometimes equal to or more than 26,800,000 colors (8-bit image data for each of RGB) are demanded.

Accordingly, in the data driver that outputs the grayscale voltage corresponding to multi-bit image data, the circuit scale of the DAC increases, and as a result, so do the chip area of the data driver LSI and costs. Therefore an operational amplifier and a digital-to-analog converter (DAC) that allow the area of the data driver to be reduced are in demand.

FIG. 18 is a circuit diagram showing the configuration of a differential amplifier used in a buffer circuit (a drive circuit that drives the data lines) in the data driver 980 shown in FIG. 17 (for analogous information, for instance, refer to Patent Document 1). This differential amplifier is an offset canceling amplifier that cancels an output offset caused by element variations, and its purpose is different from that of the present invention, however, it will be described for the sake of comparison.

Referring to FIG. 18, this conventional differential amplifier comprises a pair of NMOS transistors M3 and M4 forming a first differential pair and having commonly-connected sources connected to a low potential side power supply VSS via a constant current source M8, a pair of NMOS transistors MS and M6 forming a second differential pair and having commonly-connected sources connected to the low potential side power supply VSS via a constant current source M9, a PMOS transistor M2 having the source connected to a high potential side power supply VDD, the gate and the drain connected to each other, and the drain commonly connected to the drains of the NMOS transistors M4 and M6, a PMOS transistor M1 having the source connected to the high potential side power supply VDD, the gate connected to the gate of the PMOS transistor M2, and the drain commonly connected to the drains of the NMOS transistors M3 and M5, a PMOS transistor M7 having the source connected to the high potential side power supply VDD, the gate connected to the drain of the PMOS transistor M1, and the drain connected to an output terminal Vout, and forming an amplifier stage, a constant current source M10 connected between the output terminal Vout and the low potential side power supply VSS, capacitors C11 and C12 connected across the gate of the transistor M4 and the low potential side power supply VSS and the gate of the transistor M3 and the low potential side power supply VSS, respectively, switches SW11 and SW12 connected between the gate of the NMOS transistor M6 and an input terminal Vin and between the gate of the NMOS transistor M6 and the output terminal Vout, respectively, a switch SW16 connected between the gate of the NMOS transistor M3 and the input terminal Vin, and a switch SW13 connected between the gate of the NMOS transistor M4 and the output terminal Vout. The gate of the NMOS transistor M5 is connected to the input terminal Vin.

FIG. 19 is a timing chart showing the switch control of the circuit shown in FIG. 18. Referring to FIG. 19, in the circuit shown in FIG. 18, the switches SW11, SW13, and SW16 are turned on during a period t1, which is one data output period, and the switch 12 is turned off. The input pair of the differential pair (M3 and M4) receives an input voltage Vin and an output voltage Vout (fedback), and the input pair of the differential pair (M5 and M6) receives the input voltage Vin. At this time, a voltage (Vin+Vf) containing an offset voltage is stored in the capacitive element C11, and the input voltage Vin is stored in the capacitive element C12.

In a period t2 after this, the switches SW11, SW13, and SW16 are in an off state and the switch SW12 is in an on state. The input pair of the differential pair (M3 and M4) respectively receives the voltages Vin and (Vin+Vf) stored in the capacitive elements C12 and C11, and the input pair of the differential pair (M5 and M6) respectively receives the input voltage Vin and the output voltage Vout. Since the gate voltages of the transistors M3, M4, and M5 do not change during the periods t1 and t2, the gate voltage of the transistor M6 is maintained as well. In other words, Vout=Vin, therefore the circuit shown in FIG. 18 is able to cancel the output offset, and amplify and output a voltage equal to the input voltage.

[Patent Document 1] Japanese Patent Kokai Publication No. JP-P2001-292041A

The disclosure of the above document is incorporated herein by reference thereto.

SUMMARY OF THE DISCLOSURE

In the differential amplifier described referring to FIGS. 18 and 19, since the voltages (the input voltage Vin and the output voltage Vout) stored in the capacitive elements C11 and C12 during the period t1 are supplied to the input pair of the differential pair (M3 and M4) during the period t2, even when noise occurs in the power supply VSS, the terminal voltages of the capacitive elements C11 and C12, fluctuating in the same phase, can suppress the influence of the noise on the output voltage Vout. However, the capacitor C11 and C12 must be charged with the input charge (the charge from the input terminal Vin), and the capacitance seen from the input (the input capacitance) becomes large.

Further, in the differential amplifier shown in FIG. 18, the switches SW13 and SW16 are turned off, and the input pair (the gates) of the differential pair (M3 and M4) are cut off from the input Vin and the output Vout during the period t2. This means that only one differential pair (M5 and M6) out of the two is contributing to the amplifying operation during this time. In other words, this configuration cannot meet the demand for high-speed operation.

Accordingly, it is an object of the present invention to suppress the influences of power supply noise, signal noise, and switch noise in a differential amplifier that operationally amplifies and outputs voltages according to a plurality of input reference voltages serially supplied and provide a differential amplifier capable of high-speed operation.

It is another object of the present invention to provide a differential amplifier that substantially reduces its input capacitance.

It is a further object of the present invention to provide a digital-to-analog converter circuit, a data driver, and a display device, comprising a differential amplifier that functions as an operational amplifier capable of outputting many levels of analog voltages from few number of input reference voltages.

A yet another object of the present invention is to provide a digital-to-analog converter circuit, a data driver, and a display device, comprising a differential amplifier capable of reducing the number of decoder elements thereby reducing its area.

In order to solve the above-mentioned problems, the invention disclosed in the present application has the following configurations, in general.

In the present invention, capacitors that store a voltage are provided on both sides of a differential input pair of one of two differential pairs in a serial input operational amplifier.

A differential amplifier relating to a first aspect of the present invention comprises an input differential stage including first and second differential pairs and a load circuit commonly connected to output pairs of the first and second differential pairs; an amplifier stage that receives a common output signal from the first and second differential pairs and that charge/discharge-drives an output terminal; and first and second capacitors respectively connected to first and second inputs of an input pair of the first differential pair. The first and second inputs of the input pair of the first differential pair receives first and second signals, and first and second inputs of an input pair of the second differential pair receives a third signal and a feedback signal from the output terminal. In the present invention, the third signal may be the same signal as the first or second signal.

In the present invention, it may be configured such that first to third terminals that respectively receive the first to third signals are provided, first and second switches on/off controlled by a control signal are respectively provided between each connection point of the first and second inputs of the input pair of the first differential pair and the first and second capacitors and the first and second terminals that receive the first and second signals; and the third terminal is connected to the first input of the input pair of the second differential pair.

In the present invention, it may be configured such that a terminal that receives the first to third signals in a predetermined order is provided, the first and second inputs of the input pair of the second differential pair are respectively connected to the terminal and the output terminal, and first and second switches respectively connected between the terminal and the first and second inputs of the input pair of the first differential pair are provided.

In the present invention, a voltage obtained by adding a differential voltage between the first and second signals to the third signal is outputted from the output terminal.

A differential amplifier according to another aspect of the present invention may be configured such that it comprises: first, second, and third input terminals, and an output terminal; first and second differential pairs having output pairs commonly connected to a load circuit and driven by respective corresponding current sources; and an amplifier stage having an input end connected to at least one of common connection points of the load circuit and the output pairs of the first and second differential pairs, and an output end connected to the output terminal; and first and second inputs of an input pair of the second differential pair receives a signal from the third input terminal and a feedback signal from the output terminal. First and second switches are respectively connected between first and second inputs of an input pair of the first differential pair and the first and second input terminals; and first and second capacitors are respectively connected between each connection point of the first and second inputs of the input pair of the first differential pair and the first and second switches and a reference voltage terminal.

A differential amplifier according to another aspect of the present invention comprises: an input terminal and an output terminal; first and second differential pairs having output pairs commonly connected to a load circuit and driven by respective corresponding current sources; and an amplifier stage having an input end connected to at least one of common connection points of the load circuit and the output pairs of the first and second differential pairs, and an output end connected to the output terminal. First and second inputs of an input pair of the second differential pair receives a signal from the input terminal and a feedback signal from the output terminal; first and second switches are respectively connected between the input terminal and first and second inputs of an input pair of the first differential pair; and first and second capacitors are respectively connected between each connection point of the first and second inputs of the input pair of the first differential pair and the first and second switches and a reference voltage terminal.

In the present invention, it is preferably controlled so that during a first period, the first and second switches are both turned on and a first signal is supplied to the input terminal; during a second period following the first period, one of the first and second switches is turned on while the other is off and a second signal is supplied to the input terminal; and during a third period following the second period, the first and second switches are both turned off and a third signal is supplied to the input terminal.

In the present invention, it may be configured such that the differential amplifier comprises a third switch connected between the output terminal and a connection point of the first input of the input pair of the first differential pair, the first switch, and the first capacitor. In the present invention, it may be configured such that the differential amplifier comprises a fourth switch, which is normally turned off, connected between the output terminal and a connection point of the second input of the input pair of the first differential pair, the second switch, and the second capacitor.

In the present invention, it is preferably controlled so that the second and third switches are both turned on while the first switch is off and a first signal is supplied to the input terminal during a first period; the third switch is turned off while the first and second switches are on and the first signal is supplied to the input terminal during a second period following the first period; the third switch is turned off while one of the first and second switches is on and the other is off, and a second signal is supplied to the input terminal during a third period following the second period; and the first to third switches are turned off and a third signal is supplied to the input terminal during a fourth period following the third period.

In the present invention, it may be configured such that the differential amplifier comprises a third switch connected between the output terminal and a connection point of the first input of the input pair of the first differential pair, the first switch, and the first capacitor; a fifth switch connected between a connection point of the second input of the input pair of the first differential pair and the second switch and the second capacitor; and a fourth switch connected between the output terminal and a connection point of the second capacitor and the fifth switch. In the present invention, it may be configured such that the differential amplifier comprises a sixth switch, which is normally turned on, connected between a connection point of the first input of the input pair of the first differential pair and the first switch and a connection point of the first capacitor and the third switch.

In the present invention, it is preferably controlled, particularly for the preceding two cases, so that the first switch is turned off, the second, third, and fourth switches are on, the fifth switch is off, and a first signal is supplied to the input terminal during a first period; the first, second and fifth switches are turned on while the third and fourth switches are both off and the first signal is supplied to the input terminal during a second period following the first period; the third and fourth switches are turned off, the fifth switch is on, one of the first and second switches is on, the other is off, and a second signal is supplied to the input terminal during a third period following the second period; and the fifth switch is turned on while the first, second, third, and fourth switches are off and the third signal is supplied to the input terminal during a fourth period following the third period. In the present invention, the third signal may be the same signal as the first signal or the second signal.

A digital-to-analog converter circuit according to the present invention comprises a reference voltage generating circuit that generates a plurality of reference voltages having different levels from one another; a selection circuit that selects reference voltages from the reference voltage generating circuit as the first, second and third signals according to an input digital signal; and the differential amplifier relating to the present invention that receives the first, second, and third signals outputted from the selection circuit at the first to third terminals respectively. Or there is provided a digital-to-analog converter circuit according to the present invention which comprises: a reference voltage generating circuit that generates a plurality of reference voltages having different levels from one another; a selection circuit that selects reference voltages from the reference voltage generating circuit as the first, second and third signals according to an input digital signal, and the differential amplifier relating to the present invention that successively receives the first, second, and third signals outputted from the selection circuit at the input terminal.

According to the present invention, there is provided a data driver which comprises the digital-to-analog converter circuit, which may be those mentioned hereinabove, and drives a data line according to an image data signal supplied. A display device of the present invention comprises this data driver.

The meritorious effects of the present invention are summarized as follows.

According to the present invention, a differential amplifier capable of operationally amplifying and outputting according to a plurality of input reference voltages supplied serially or successively can be realized and power supply/signal noises and switch noise can be reduced. Further, according to the present invention, it is possible to have two differential pairs contribute to the amplifying operation thereby achieving high-speed operation.

According to the present invention, the input capacitance can be reduced by decreasing the capacitance values of capacitors connected to the input pair of a differential pair.

Further, according to the present invention, in a digital-to-analog converter circuit comprising a differential amplifier capable of operationally amplifying and outputting according to a plurality of input reference voltages supplied serially, the configuration of a decoder circuit can be simplified thereby reducing the area of the circuit.

BRIEF DESCRIPTIONS OF THE DRAWINGS

FIGS. 11A and 10B are drawings for explaining the third relationship between three signal voltages and output voltages of the differential amplifier of the present invention.

PREFERRED MODES OF THE INVENTION

Figure 1:
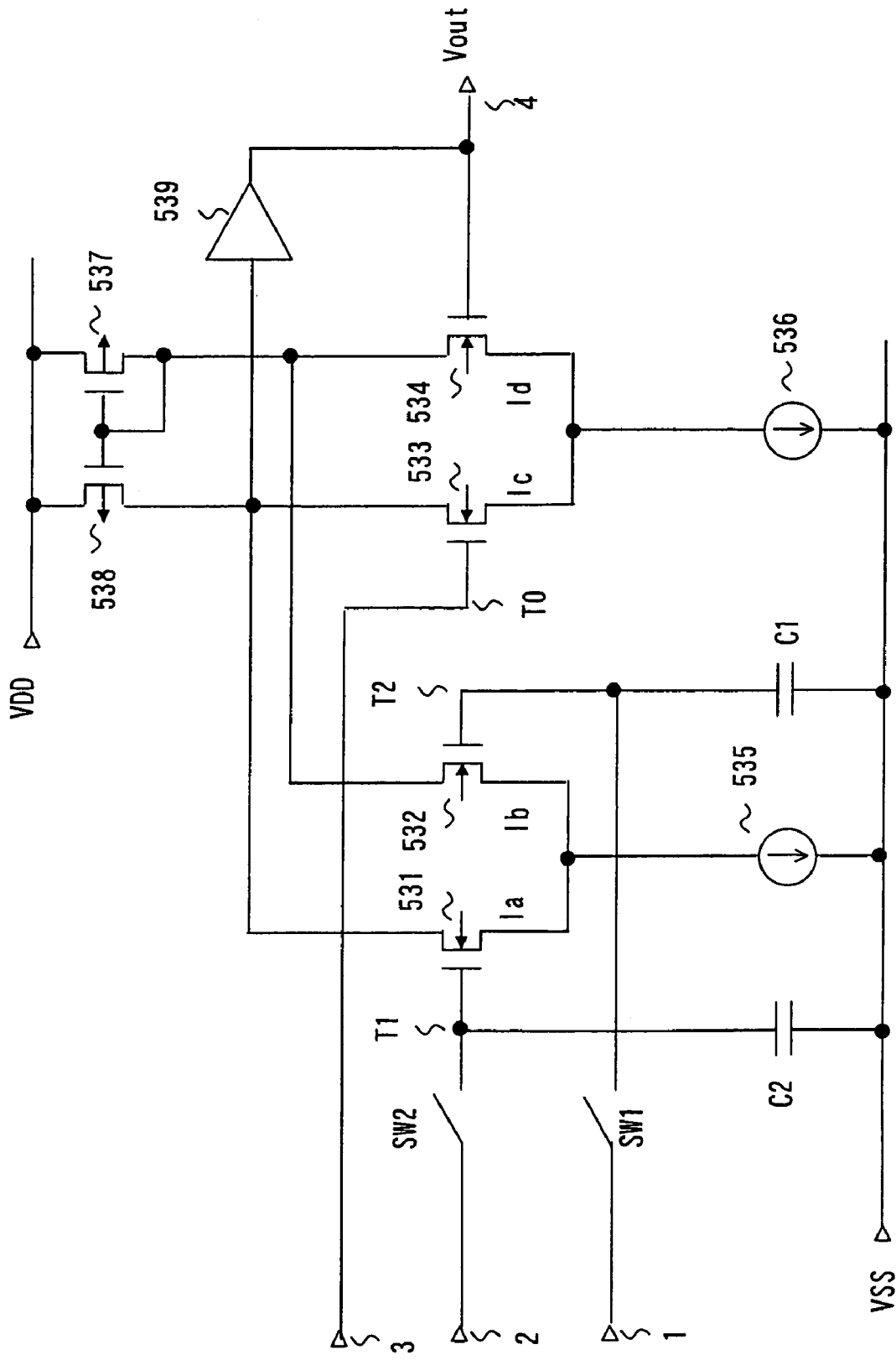
FIG. 1 is a drawing showing the configuration of a differential amplifier relating to a first example of the present invention.

The modes for carrying out the present invention will be further described in detail with reference to the attached drawings. Referring to FIG. 1, a differential amplifier relating to one example of the present invention has first, second, and third input terminals (1, 2, and 3), an output terminal (4), and transistor pairs (531 and 532) (533 and 534) having the output pairs commonly connected to load circuits (537 and 538), being respectively driven by a corresponding current source (535 and 536), and forming first and second differential pairs, and comprises an amplifier stage (539) having the input end connected to at least one of the common connection points of the load circuits (537 and 538) and the output pairs of the first and second differential pairs (531 and 532) (533 and 534) and the output end connected to the output terminal (4). The first and second inputs (T0 and the gate of 534) of the input pair of the second differential pair (533 and 534) receives a signal from the third input terminal (3) and a feedback signal from the output terminal (4), and first and second switches (SW1 and SW2) are respectively connected between the first and second inputs (T2 and T1) of the input pair of the first differential pair (531 and 532) and the first and second input terminals (1 and 2). Between the first and second inputs (T2 and T1) of the input pair of the first differential pair (531 and 532) and a reference voltage terminal (VSS), first and second capacitors (C1 and C2) are respectively connected.

Figure 2:
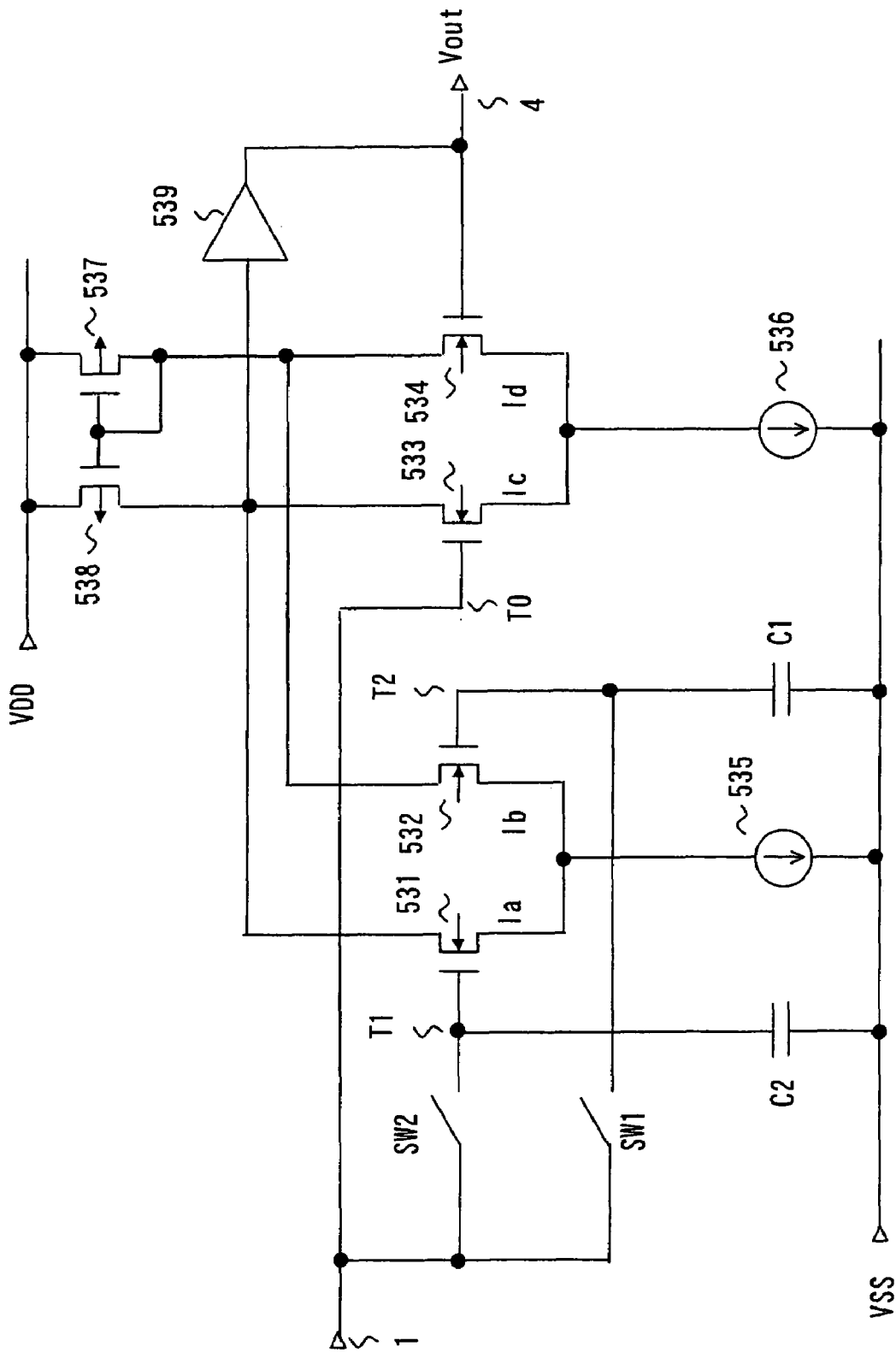
FIG. 2 is a drawing showing the configuration of a differential amplifier relating to a second example of the present invention.

Referring to FIG. 2, another example of the present invention comprises s terminal (1) that supplies first, second, and third signals in a predetermined order; a differential input stage that includes transistor pairs (531 and 532) (533 and 534) forming first and second differential pairs and load circuits (537 and 538) commonly connected to output pairs of the first and second differential pairs (531 and 532) (533 and 534); and an amplifier stage (539) having its input ends connected to at least one of the common connection points of the output pairs of the first and second differential pairs (531 and 532) (533 and 534) and its output end connected to an output terminal (4). The first and second inputs (T2 and T1) of the input pair of the first differential pair (531 and 532) are connected to the terminal (1) via first and second switches (SW1 and SW2) respectively, and the first and second inputs (T0 and the gate of 534) of the input pair of the second differential pair (533 and 534) are the terminal (1) and the output terminal (4) respectively. In this circuit configuration, it may be controlled so that, during a first period, the first and second switches (SW1 and SW2) are turned on and the first signal is supplied to the terminal (1); during a second period following the first period, the first or the second switch (SW1 or SW2) is turned on while the other is off, and the second signal is supplied to the terminal (1); and during a third period following the second period, the first and second switches (SW1 and SW2) are turned off, and the third signal is supplied. Examples will be further described.

EXAMPLES

Example 1

FIG. 1 is a drawing showing the configuration of a differential amplifier of a first example of the present invention. Referring to FIG. 1, the differential amplifier of this example comprises NMOS transistors 532 and 531 constituting the first differential pair (531 and 532), and having their sources connected in common and their gates respectively connected to the terminals 1 and 2 via switches SW1 and SW2, a constant current source 535 connected between the common source of the NMOS transistors 532 and 531 and the low potential side power supply VSS, NMOS transistors 533 and 534 constituting the second differential pair (533 and 534), and having the sources connected in common and the gates respectively connected to the terminal 3 and the output terminal 4, the constant current source 536 connected between the common source of the NMOS transistors 533 and 534 and the low potential side power supply VSS, a PMOS transistor 537 having the source connected to a high potential side power supply VDD and the drain and the gate connected to each other, and a PMOS transistor 538 having the source connected to the high potential side power supply VDD and the gate connected to the gate of the PMOS transistor 537. The drain of the PMOS transistor 537 is commonly connected to the drain of the NMOS transistors 532 and 534, and the drain of the PMOS transistor 538 is commonly connected to the drains of the NMOS transistors 531 and 533. Further, the drain of the PMOS transistor 538 is connected to the input end of an amplifier stage 539, and the output end of the amplifier stage 539 is connected to the output terminal 4 of the differential amplifier. Between the connection node (terminal) T1 of the switch 2 and the gate of the NMOS transistor 531, and the low potential side power supply VSS, a capacitor C2 is connected, and a capacitor C1 is connected between the connection node (terminal) T2 of the switch 1 and the gate of the NMOS transistor 532, and the low potential side power supply VSS. The PMOS transistors 537 and 538 constitute a current mirror circuit functioning as a common active load for the differential pairs (531 and 532) (533 and 534).

In order to describe the operating principle of the circuit configuration shown in FIG. 1, a circuit shown in FIG. 15, which is a basic circuit for the circuit shown in FIG. 1, will be described. A differential amplifier shown in FIG. 15 has first and second differential pairs. The input pair of the first differential pair is connected to terminals T1 and T2, and the input pair of the second differential pair is connected to a terminal T0 and an output terminal 4. The differential amplifier operationally amplifies voltages V(T0), V(T1), and V(T2) supplied to the terminals T0, T1, and T2, and outputs the resulting voltages. More concretely, it comprises two differential stages (the differential transistor pair 531 and 532, a current source transistor 535; the differential transistor pair 533 and 534, and a current source transistor 536) having each output pair connected to a current mirror (constituted by transistors 537 and 538) forming a load circuit. The gates of the transistor 531 and 532, forming a non-inverting input end and an inverting input end of the differential pair (531 and 532), are respectively connected to the terminals T1 and T2, and a non-inverting input end and an inverting input end (the gates of the transistors 533 and 534) of the differential pair (533 and 534) are respectively connected to the terminal T0 and the output terminal 4. An amplifier stage 539 receives a voltage at the output end (the connection node of the transistors 531, 533, and 538) of the current mirror (537 and 538), and the output end is connected to the output terminal 4.

Figure 15:
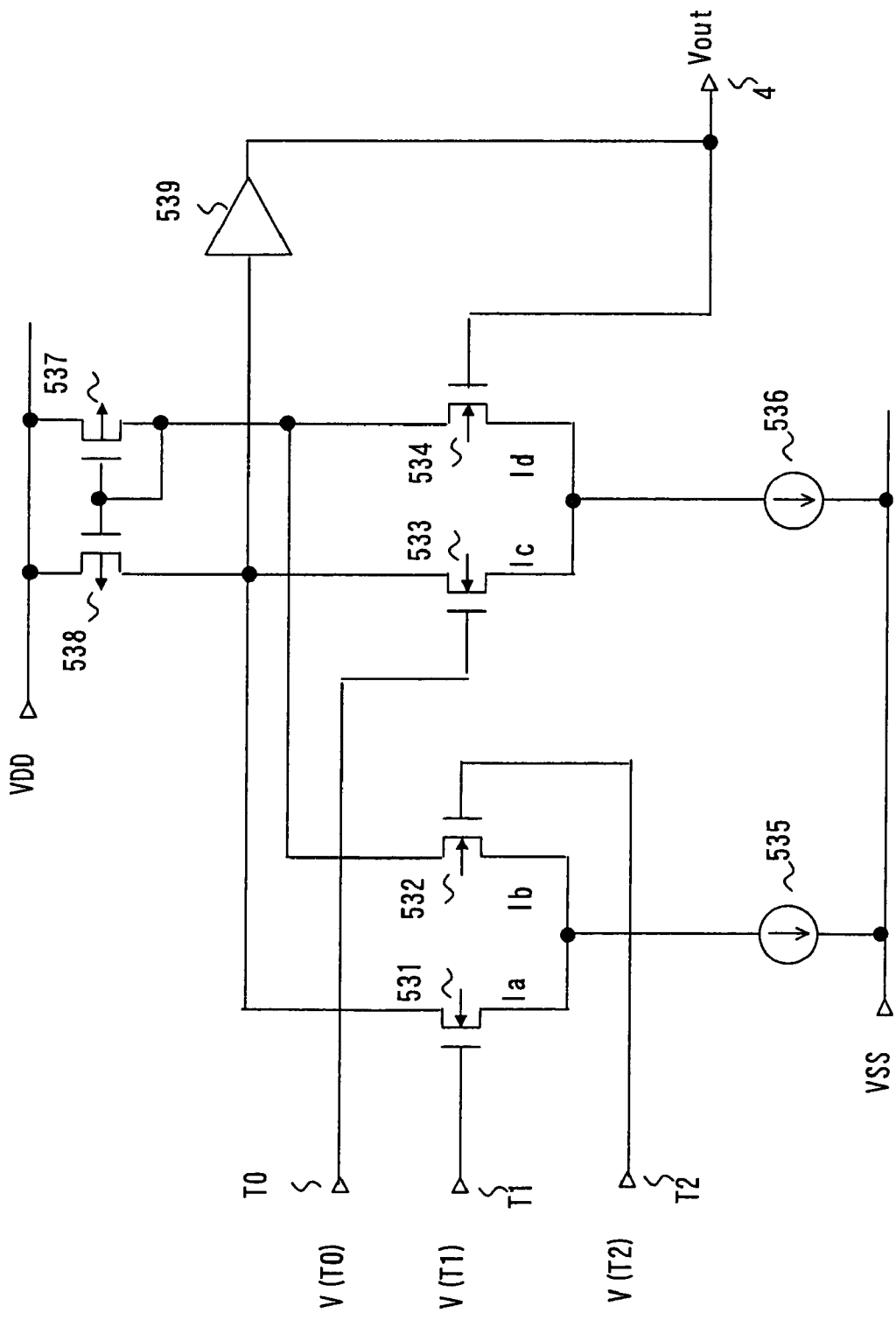
FIG. 15 is a drawing for explaining the basic operation of the differential amplifier of the present invention.
Figure 16:
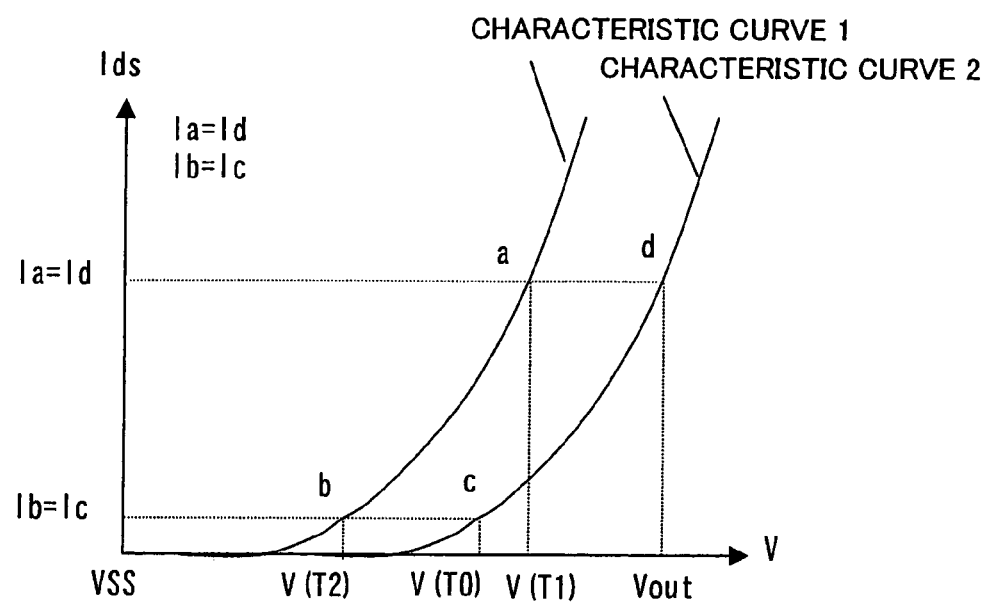
FIG. 16 shows V-I characteristics for explaining the basic operation of the differential amplifier of the present invention.

In FIG. 15, when the two pairs of the differential transistors are constituted by transistors of the same size, and it is set so that the currents of the current sources (535 and 536) that drive each differential pair are equal, a voltage obtained by adding the differential voltage $\{V(T1)-V(T2)\}$ between V(T1) and V(T2) to V(T0) can be outputted as an output voltage Vout. This principle will be explained with reference to FIG. 16. FIG. 16 is a drawing for explaining cases when V(T1)>V(T2). FIG. 16 shows a characteristic curve 1 of the transistors 531 and 532 and a characteristic curve 2 of the transistors 533 and 534 in terms of the relationship between the drain-source current Ids and the gate voltage V. The operating points of these transistors are found on their characteristic curves. Note that one of the characteristic curves is simply shifted from the other on the abscissa axis because the source potentials of the two differential pairs change individually.

When the currents (the drain-source currents) corresponding to the operating points a, b, c, and d of the transistors 531, 532, 533, and 534 are Ia, Ib, Ic, and Id respectively, the following formulas hold as the relationships between the transistors in FIG. 16.

$$Ia+Ib=Ic+Id \quad (1)$$

$$Ia+Ic=Ib+Id \quad (2)$$

Here, the formula (1) is derived from the fact that the currents of the current sources 535 and 536 are equal, and the formula (2) is derived from the fact that the input/output currents of the current mirror (537 and 538) are equal.

By solving the equations above, the following formula (3) is derived.

$$Ia=Id, Ib=Ic \quad (3)$$

From the formula (3), the four operating points a, b, c, and d are determined as shown in FIG. 16. Here, since a segment ad and a segment bc are equal, potential differences $\{Vout-V(T1)\}$ and $\{V(T0)-V(T2)\}$ corresponding to these segments respectively are equal as well. Therefore, the output voltage Vout is given by the following formula (4).

$$Vout=V(T0)+\{V(T1)-V(T2)\} \quad (4)$$

In the formula (4), when V(T0)=V(T1), $$Vout=\{2\cdot V(T1)-V(T2)\}.$$

Therefore, it becomes an extrapolating amplifier that extrapolates V(T1) and V(T2) to 1:2.

Further, in the formula (4), when V(T2)=Vout, $$Vout=\{V(T0)+V(T1)\}/2.$$

Therefore, it becomes an interpolating amplifier that interpolates V(T0) and V(T1) to 1:1.

FIG. 16 shows a case where $V(T1) \geq V(T2)$, however, it operates similarly in a case where $V(T1) \leq V(T2)$.

The actions (the operating principle) shown in FIG. 16 still hold even when the voltage difference between the two voltages V(T1) and V(T2) changes. Therefore, the operational amplifier circuit shown in FIG. 15 is capable of a highly accurate output. However, there is a limit to the range of the voltage difference between the two voltages V(T1) and V(T2), and the differential pair (531 and 532) in FIG. 15 can perform a differential operation only within this voltage difference range. Therefore, the values of the voltages V(T1) and V(T2) should be relatively close whereas the value of the voltage V(T0) can be at any value between the low potential power supply VSS and the high potential power supply VDD.

The configuration in FIG. 1 comprises the capacitors C2 and C1 respectively connected between the terminal T1 and VSS, and the terminal T2 and VSS, and the switches SW2 and SW1 connected between the terminals T1 and 2, and between the terminals T2 and 1, in addition to the configuration in FIG. 15. Other than that, the configuration in FIG. 1 is identical to the configuration in FIG. 15.

According to this example, since the capacitors C2 and C1 are connected to the differential input pair of the differential pair (531 and 532), and the voltages received by the terminals T1 and T2 can be stored there, voltages do not have to be supplied to the input terminals T0, T1, and T2 simultaneously. (i.e., the voltages may be supplied at different timings)

In this example, the output voltage Vout is as given by the formula (4).

According to this example, by providing the capacitors C1 and C2 and the switches SW1 and SW2 at the input pair (the gates) of the differential pair (531 and 532), the influences of power supply/signal noise and switch noise (SW1 and SW2) can be suppressed, and a highly accurate output voltage can be achieved. This is because, in this example, the potential of the input pair of the differential pair (531 and 532) fluctuates in the same phase (i.e., in phase) as the power supply/signal noise, the potential difference (the differential voltage) across the input pair is maintained, and the output voltage is not influenced by the noise. Therefore the capacitance of the capacitors C1 and C2 can be made small, resulting in a small input capacitance.

Further, in this example, the on/off control of the switches SW1 and SW2 does not necessarily have to be in phase, and the timings may be shifted. It is one of the features of the present invention that the power supply/signal noise and switch noise can be canceled even if the timings of the on/off control of the switches SW1 and SW2 are shifted.

The switches SW1 and SW2 are on/off controlled according to the supply of the voltages received by the terminals T2 and T1, and the voltages V(T2) and V(T1) are respectively stored in the capacitors C1 and C2.

The switches SW1 and SW2 are turned on, and the voltages V(T2) and V(T1) are respectively stored in the capacitors C1 and C2. Then the switches SW1 and SW2 are turned off, and the voltage obtained by adding the differential voltage V(T1)−V(T2) across the terminals T1 and T2 to the voltage V(T0) of the terminal T0 (the formula (4)) is outputted as the output voltage Vout.

In this example, when V(T0)=V(T1), it becomes an extrapolating amplifier that extrapolates V(T1) and V(T2) to 1:2. Further, when V(T2)=Vout, it becomes an interpolating amplifier that interpolates V(T0) and V(T1) to 1:1.

Further, in this example, the other ends of the capacitors C1 and C2 having one ends respectively connected to the terminals T2 and T1 do not have to be connected to the low potential power supply VSS. In other words, the other ends of the capacitors C1 and C2 may be commonly connected to a terminal of any potential other than the low potential power supply VSS. This applies to the other examples described later.

Example 2

Next, a second example of the present invention will be described. FIG. 2 is a drawing showing the configuration of the second example of the present invention. Referring to FIG. 2, this example has the same configuration as the differential amplifier shown in FIG. 1 except that the terminals 1, 2, and 3 are made into one common terminal 1. Note that the terminal T0 is directly connected to the terminal 1. One ends of the switches SW1 and SW2 are respectively connected to the input pair (the terminals T2 and T1) of the differential pair (531 and 532), and the other ends are connected in common to the terminal 1. Other than that, the configuration of this example is identical to that of the first example described above.

In this example, the voltages received by the terminals T0, T1, and T2 are supplied serially from the terminal 1. The switches SW1 and SW2 are switch-controlled from ON to OFF in the order of the voltages supplied to the terminals T2 and T1, and the voltages from the terminal 1 are respectively stored in the capacitors C1 and C2.

From the three signal voltages V(T0), V(T1), and V(T2) serially supplied, the voltage Vout=V(T0)+{V(T1)−V(T2)}, the same as given by the formula (4), is obtained and outputted.

Figure 3:
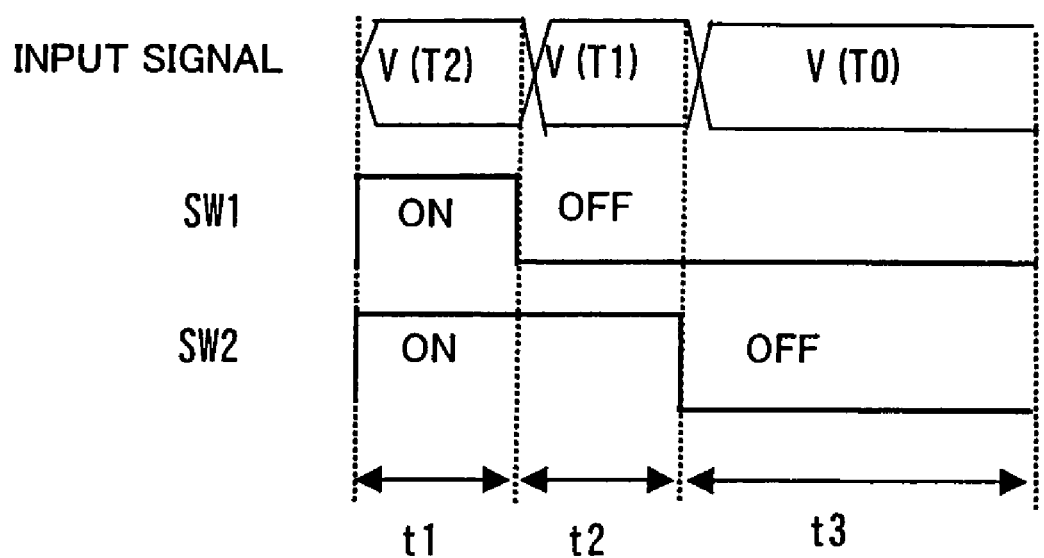
FIG. 3 is a drawing showing the first relationship between the switch control and voltage input of the differential amplifier relating to the second example of the present invention.

FIG. 3 is a drawing for explaining an operation of the differential amplifier in FIG. 2. FIG. 3 shows the order in which the voltages V(T0), V(T1), and V(T2), eventually received by the terminals T0, T1, and T2 of the differential pairs, are supplied from the input terminal 1 during a data period and how the switches SW1 and SW2 are on/off controlled. In FIG. 3, V(T2), V(T1), and V(T0) are supplied in this order in periods t1, t2, and t3 respectively.

During the period t1, the switches SW1 and SW2 are both turned on, and the voltage V(T2) is supplied to the terminals T2 and T1 from the terminal 1 and stored in the capacitors C1 and C2. At this time, the voltage of the terminal T1 is V(T2). Since the voltage V(T2) is supplied to the terminal T0 as well, from the formula (4), the voltage Vout of the output terminal 4 is as follows.

$Vout=V(T2)$.

During the period t2, the switch SW1 is turned off, and the switch SW2 is kept on. At this time, the terminal T2 holds the voltage V(T2), which is stored in the capacitor C1, and the voltage V(Ti) is supplied to the terminal T1 from the terminal 1 and is stored in the capacitor C2. Further, the voltage V(T1) is also supplied to the terminal T0. From the formula (4), the voltage Vout of the output terminal 4 is as follows.

$Vout=\{2 \cdot V(T1) - V(T2)\}$

During the period t3, the switches SW1 and SW2 are both turned off, and at this time, the terminals T2 and T1 respectively hold the voltages V(T2) and V(T1), which are stored in the capacitors C1 and C2. Further, since the voltage V(T0) is supplied to the terminal T0 as well, from the formula (4), the voltage Vout of the output terminal 4 is as follows.

$Vout=V(T0)+\{V(T1)-V(T2)\}$

In this example, when the voltage V(T0) supplied from the terminal 1 during the period t3 is equal to V(T1), the output voltage Vout={2·V(T1)−V(T2)} of the period t2 is continued to be outputted from the output terminal 4 during the period t3. At this time, the output voltage Vout extrapolates V(T1) and V(T2) to 1:2.

Figure 4:
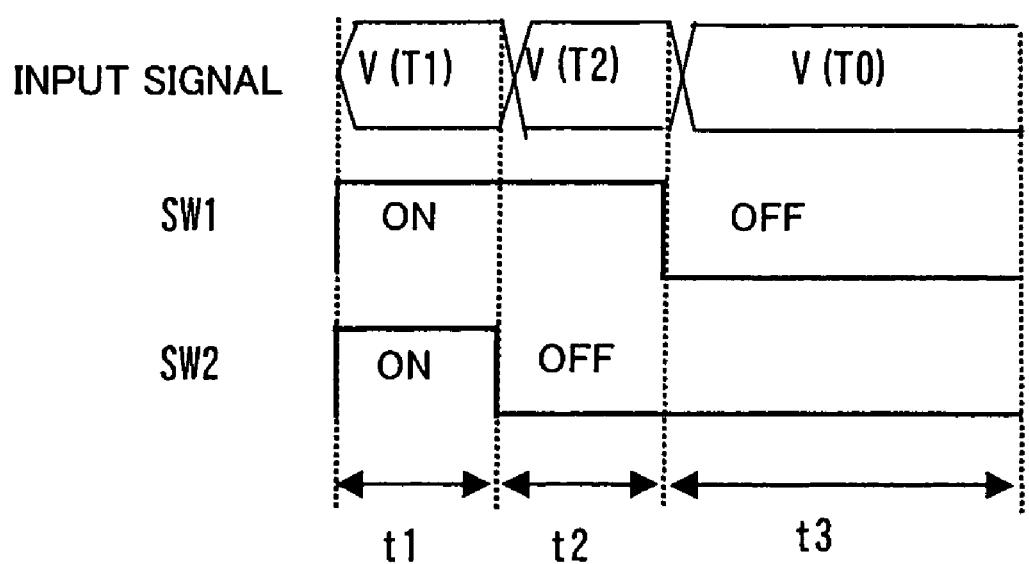
FIG. 4 is a drawing showing the second relationship between the switch control and voltage input of the differential amplifier relating to the second example of the present invention.

FIG. 4 is a drawing for explaining another operation of the differential amplifier shown in FIG. 2. FIG. 4 shows the order in which the voltages V(T0), V(T1), and V(T2), eventually received by the terminals T0, T1, and T2 of the differential pairs, are supplied from the input terminal 1 and how the switches SW1 and SW2 are on/off controlled. In the example in FIG. 4, V(T1), V(T2), and V(T0) are supplied in this order in the periods t1, t2, and t3.

During the period t1, the switches SW1 and SW2 are both turned on, and the voltage V(T1) is supplied to the terminals T2 and T1 from the terminal 1 and stored in the capacitors C1 and C2. At this time, the voltage of the terminal T2 is V(T1). Since the voltage V(T1) is supplied to the terminal T0 as well, from the formula (4), the voltage Vout of the output terminal 4 is as follows.

$Vout=V(T1)$

During the period t2, the switch SW2 is turned off, and the switch SW1 is kept on. At this time, the terminal T1 holds the voltage V(T1), which is stored in the capacitor C2, and the voltage V(T2) is supplied to the terminal T2 from the terminal 1 and is stored in the capacitor C1. Further, the voltage V(T2) is also supplied to the terminal T0. From the formula (4), the voltage Vout of the output terminal 4 is as follows.

$Vout=V(T1)$

During the period t3, the switches SW1 and SW2 are both turned off, and at this time, the terminals T2 and T1 respectively hold the voltages V(T2) and V(T1) stored in the capacitors C1 and C2. Further, since the voltage V(T0) is supplied to the terminal T0, from the formula (4), the voltage Vout of the output terminal 4 is as follows.

$Vout=V(T0)+\{V(T1)-V(T2)\}$

Example 3

Figure 5:
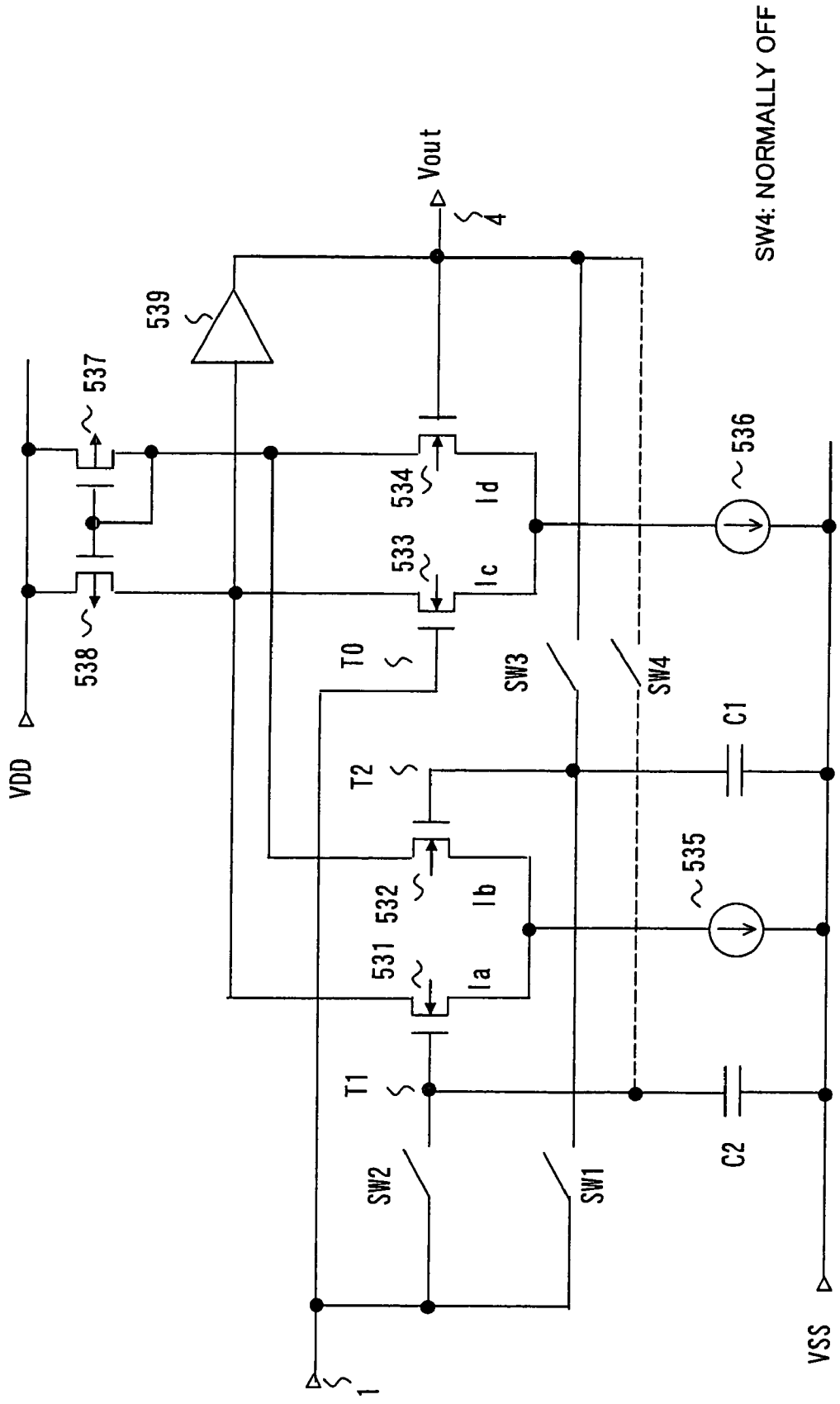
FIG. 5 is a drawing showing the configuration of a differential amplifier relating to a third example of the present invention.

Next, a third example of the present invention will be described. FIG. 5 is a drawing showing the configuration of the third example of the present invention. Referring to FIG. 5, this example further comprises a switch SW3 connected between the output terminal 4 and the terminal T2 and a switch SW4 connected between the output terminal 4 and the terminal T1, in addition to the configuration of the differential amplifier shown in FIG. 2. Other than that, the configuration of this example is identical to the configuration shown in FIG. 2. This example differs from the second example described above in how the switches are controlled.

Figure 6:
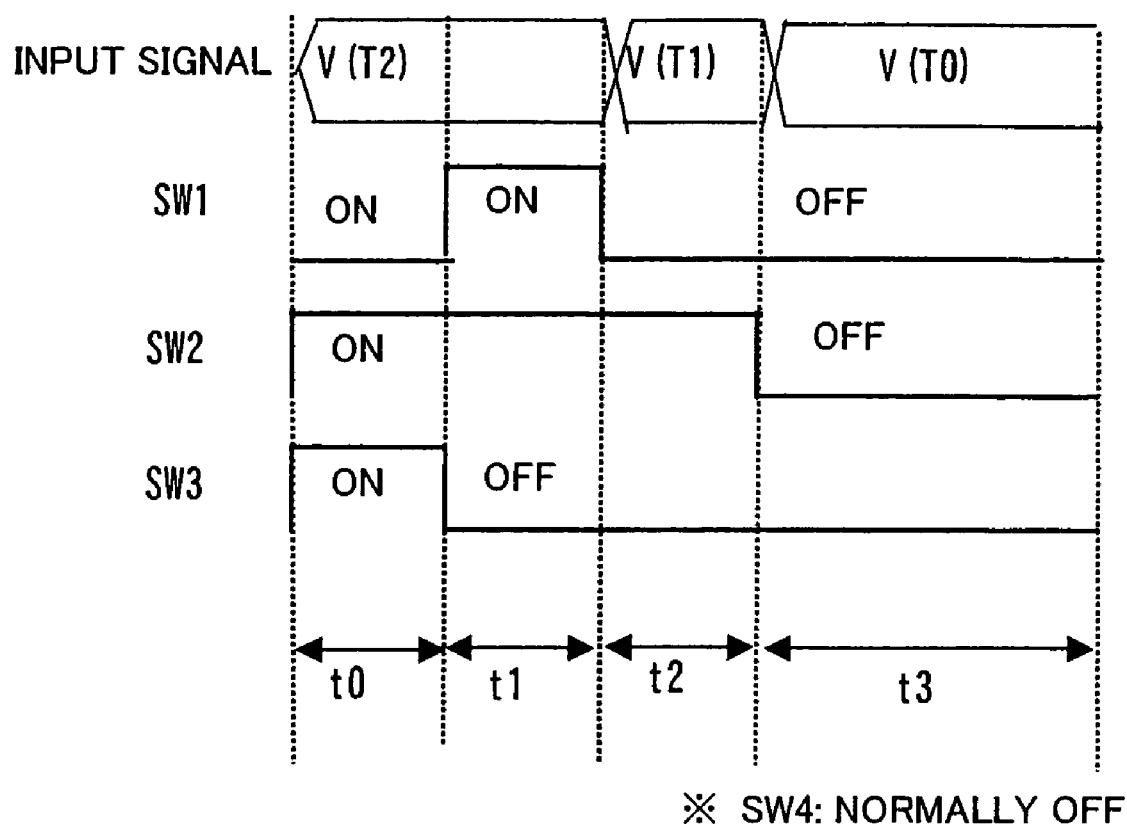
FIG. 6 is a drawing showing the relationship between the switch control and voltage input of the differential amplifier relating to the third example of the present invention.

FIG. 6 is a drawing for explaining the operation of the differential amplifier shown in FIG. 5, and it shows the order in which the voltages V(T0), V(T1), and V(T2), eventually received by the terminals T0, T1, and T2 of the differential pairs, are supplied from the input terminal 1 during a data period and how the switches SW1, SW2, and SW3 are on/off controlled. Referring to FIG. 6, compared to the periods t1, t2, and t3 in FIG. 3, a period t0 is inserted before t1, and V(T2), V(T2), V(T1), and V(T0) are supplied in this order in the periods t0, t1, t2, and t3 respectively. Note that the switch SW4 is normally turned off in this example. The switch SW4 is a dummy switch that provides the parasitic capacitance of the switch SW4 to the terminal T1, corresponding to the parasitic capacitance of the switch SW3 at the terminal T2. Therefore the switch SW4 may be omitted when the switch parasitic capacitance in an OFF state can be ignored.

During the period t0, the switch SW1 is turned off, and SW2 and SW3 are both tuned on. The voltage V(T2) is supplied to the terminals T0 and T1 from the terminal 1 and is stored in the capacitor C2 while the terminal T2 is connected to the output terminal 4. At this time, the voltage V(T2) is supplied to the non-inverting input ends (T0, T1) of the two differential pairs (531 and 532) (533 and 534), forming a voltage follower configuration where the output terminal 4 is connected to the inverting input ends, making it possible to vary the output voltage Vout at high speed. The voltage Vout of the output terminal 4 becomes Vout=V(T2). From the output terminal 4, the voltage V(T2) is supplied to the capacitor C1 and stored there. During the periods t1, t2, and t3, the switch SW3 is turned off, and the switches are controlled identically to the control shown in FIG. 3, therefore the explanation of it will be omitted.

This example differs from the second example in that, when the output voltage Vout changes greatly from the output voltage of the previous data period in the second example, in order to change the output voltage Vout at high speed, it is necessary to increase the current values of the current sources 535 and 536 since only the voltage follower-connected differential pair (533 and 534) is active in the voltage change.

On the other hand, since the two differential pairs (531 and 532) (533 and 534) are active in the voltage change during the period t0 in this example, high-speed operation is possible without increasing the currents of the current sources 535 and 536. In the period t0, the output voltage Vout is at V(T2). Therefore the high-speed operation is effectively performed when the output voltage Vout=V(T0)+{V(T1)−V(T2)} of the period t3 is relatively close to V(T2).

Further, the example in which the period t0 is inserted before the periods t1, t2, and t3 in FIG. 3 is shown in FIG. 6, however, it is also possible to achieve a high-speed change of the output voltage Vout by inserting the period t0 before t1 of the periods t1, t2, and t3 shown in FIG. 4 and performing the same switch control. In this case, the output voltage Vout of the period t0 becomes V(T1), the switch SW3 is turned off from the period t1 on, and the same control as FIG. 4 is performed.

Example 4

Figure 7:
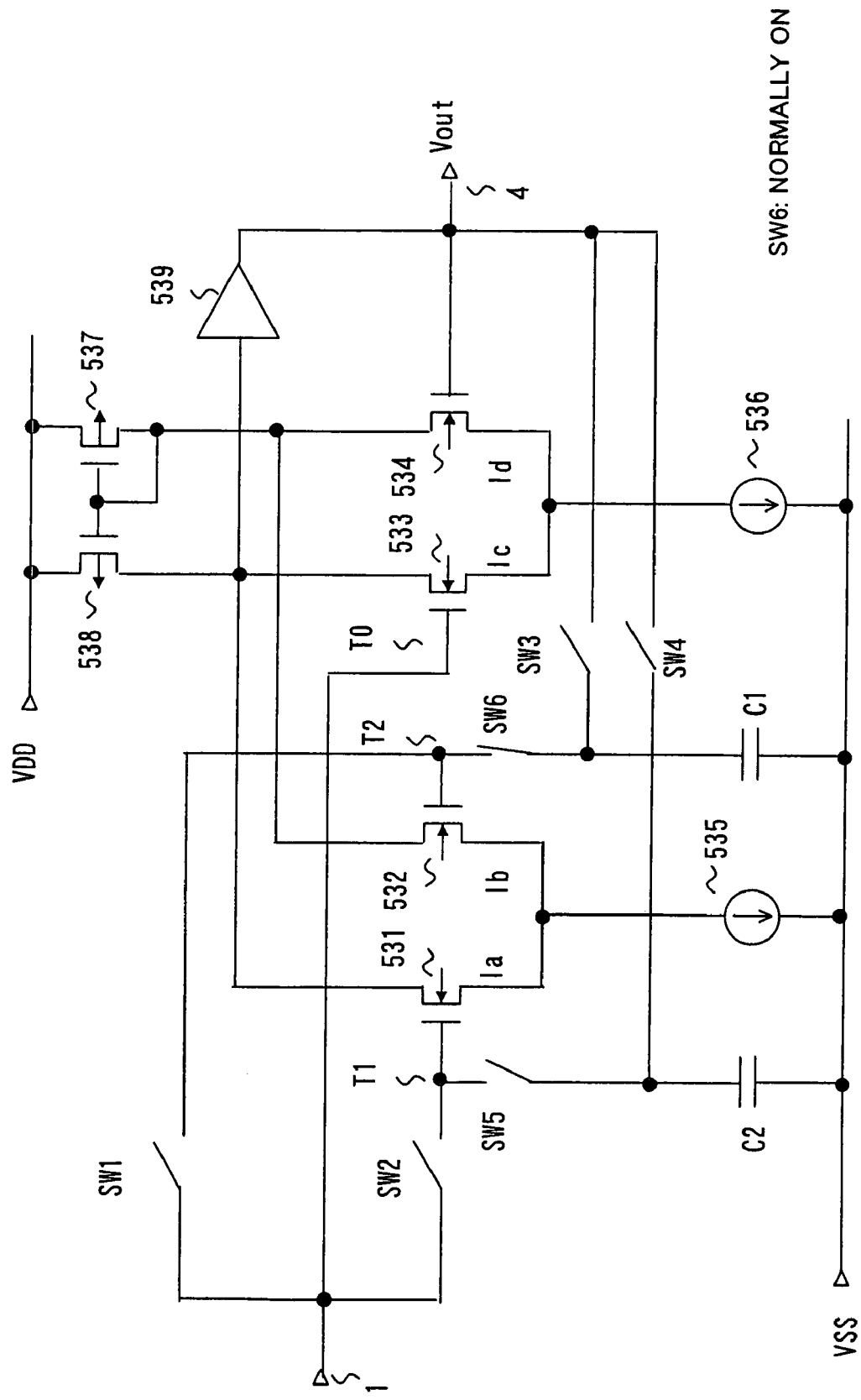
FIG. 7 is a drawing showing the configuration of a differential amplifier relating to a fourth example of the present invention.

Next, a fourth example of the present invention will be described. FIG. 7 is a drawing showing the configuration of the fourth example of the present invention. Referring to FIG. 7, this example comprises a switch SW5 connected between the terminal T1 and the capacitor C2 and a switch SW6 connected between the terminal T2 and the capacitor C1, in addition to the configuration of the third example shown in FIG. 5. Other than that, the configuration of this example is identical to the configuration in FIG. 5. This example differs from the second and third examples in how the switches are controlled.

Figure 8:
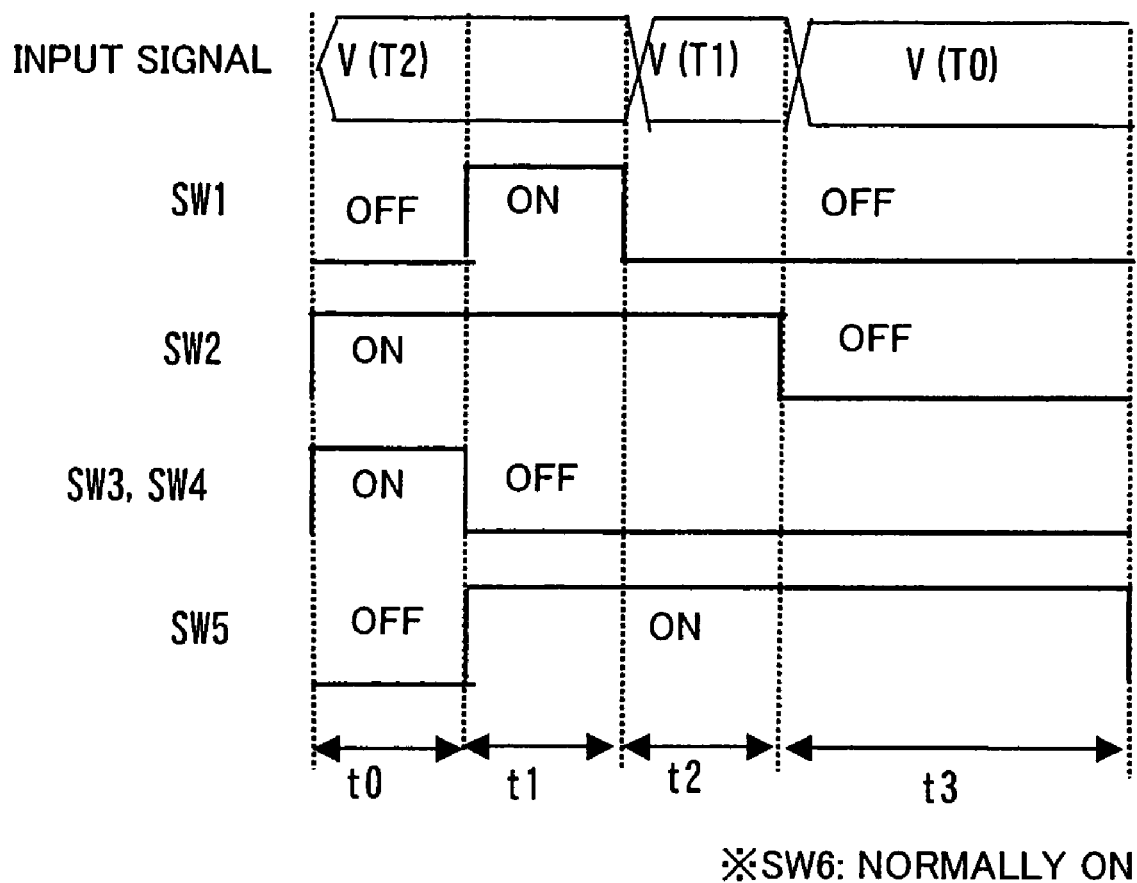
FIG. 8 is a drawing showing the relationship between the switch control and voltage input of the differential amplifier relating to the fourth example of the present invention.

FIG. 8 is a drawing for explaining the operation of the differential amplifier in FIG. 7, and it shows the order in which the voltages V(T0), V(T1), and V(T2), eventually received by the terminals T0, T1, and T2 of the differential pairs, are supplied from the input terminal 1 during a data period and how the switches SW1, SW2, SW3, SW4, and SW5 are on/off controlled. Referring to FIG. 8, compared to the periods t1, t2, and t3 in FIG. 3, a period t0 is inserted before t1, and V(T2), V(T2), V(T1), and V(T0) are supplied in this order in the periods t0, t1, t2, and t3 respectively. The switch SW6 is a dummy switch that is normally turned on. The switch SW6 is a dummy switch that provides the parasitic capacitance of the switch SW6 at the terminal T2, corresponding to the parasitic capacitance of the switch SW5 at the terminal T1. Therefore the switch SW6 may be omitted when the switch parasitic capacitance in an ON state can be ignored.

During the period t0, the switches SW1 and SW5 are turned off, and SW2, SW3, and SW4 are tuned on. The voltage V(T2) is supplied to the terminals T0 and T1 from the terminal 1 while the terminal T2 is connected to the output terminal 4. At this time, the voltage V(T2) is supplied to the non-inverting input ends of the two differential pairs (531 and 532) (533 and 534), where the output terminal 4 is connected to the inverting input ends forming a voltage follower configuration, making it possible to vary the output voltage Vout at high speed. The voltage Vout of the output terminal 4 becomes Vout=V(T2), and the voltage V(T2) is supplied to the capacitors C1 and C2 from the output terminal 4 via SW3 and SW4 and is stored there. During the periods t1, t2, and t3, the switches SW3 and SW4 are turned off while the switch SW5 is on. In other words, the switches are controlled identically to the control shown in FIG. 3.

This example differs from the second example in that, in this example, the two differential pairs are active in the output change during the period t0, making it possible to achieve high-speed operation as in the third example.

Further, unlike the third example, since the amplified voltage V(T2) is supplied to the both capacitors C1 and C2 from the output terminal 4 and the charge is stored there in this example, the capacitors C1 and C2 only need to store the differential amount between the input voltage and the output voltage from the period t1 on, essentially reducing the input capacitance. Therefore, the charge amount supplied externally via the input terminal 1 can be reduced. Further, by reducing the input capacitance, it becomes possible to achieve high-speed operation and simplify the external circuit that supplies voltages to the input terminal 1.

Further, the example in which the period t0 is inserted before the t1 of the periods t1, t2, and t3 in FIG. 3 is shown in FIG. 8, however, it is also possible to achieve a high-speed change of the output voltage Vout and essentially reduce the input capacitance by inserting the period t0 before t1 of the periods t1, t2, and t3 shown in FIG. 4 and performing the similar switch control. In this case, the output voltage Vout of the period t0 becomes V(T1), the switches SW3 and SW4 are turned off while the switch SW5 is on from the period t1 on, and the same control as FIG. 4 is performed.

Example 5

Figures 9A, 9B:
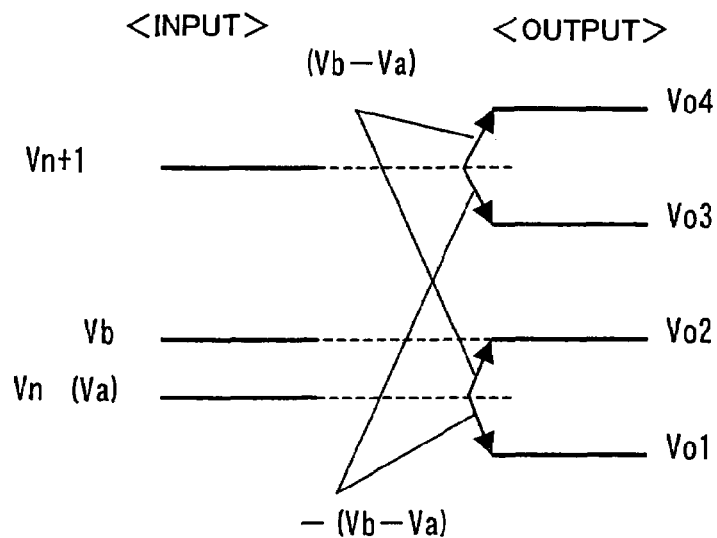
FIGS. 9A and 9B are drawings for explaining the first relationship between three signal voltages and output voltages of the differential amplifier of the present invention.

FIGS. 9A and 9B are drawings for explaining an example in which the differential amplifier of the present invention outputs multi-valued voltages. FIG. 9A shows the relationship between the input and output levels, and FIG. 9B shows voltage selection states in which four output levels are related to 2-bit digital data (D1, D0).

In FIG. 9A, a case where there are three levels of the input voltages, voltages $V_n$, $V_{n+1}$, Va, and Vb (where Va=$V_n$, $V_n$<$V_{n+1}$), is shown.

By selectively feeding the voltages $V_n$ (Va), $V_{n+1}$, and Vb to the voltages V(T1), V(T2), and V(T0), four levels of the output voltages Vo1 to Vo4 can be outputted.

More concretely, when outputting the voltage Vo1, the input voltages are selected so that (V(T1), V(T2), V(T0))=(Va, Vb, $V_n$). Then, from the formula (4), the following formula (5) results:

$$Vo1 = V_n - (Vb - Va) \tag{5}$$

In other words, the voltage Vo1 is obtained by level-shifting $V_n$ to the low potential side by the amount of the potential difference (Vb−Va).

Further, when outputting the voltage Vo2, the input voltages are selected so that (V(T1), V(T2), V(T0))=(Vb, Va, $V_n$). Then, the following formula results:

$$Vo2 = V_n + (Vb - Va) \tag{6}$$

In other words, the voltage Vo2 is obtained by level-shifting $V_n$ to the high potential side by the amount of the potential difference (Vb−Va).

Further, when outputting the voltage Vo3, the input voltages are selected so that (V(T1), V(T2), V(T0))=(Va, Vb, $V_{n+1}$). Then, it follows:

$$Vo3 = V_{n+1} - (Vb - Va) \tag{7}$$

In other words, the voltage Vo3 is obtained by level-shifting $V_{n+1}$ to the low potential side by the amount of the potential difference (Vb−Va).

Further, when outputting the voltage Vo4, the input voltages are selected so that (V(T1), V(T2), V(T0))=(Vb, Va, $V_{n+1}$). Then, it follows:

$$Vo4 = V_{n+1} + (Vb - Va) \tag{8}$$

In other words, the voltage Vo4 is obtained by level-shifting $V_{n+1}$ to the high potential side by the amount of the potential difference (Vb−Va).

As described, from the three input voltages $V_n$ (Va), $V_{n+1}$, and Vb, the four levels of voltages Vo1, Vo2, Vo3, and Vo4 can be outputted.

Further, in FIG. 9A, when it is set so that the potential difference between Vb and Va is a quarter of the potential difference between $V_{n+1}$ and $V_n$, the differences between the four output levels become the potential difference (Vb−Va) to be all equal difference from one to the next.

Further, as shown in FIG. 9B, the four voltages Vo1 to Vo4 can be selectively outputted by 2-bit digital data (D1, D0).

FIGS. 9A and 9B show the example having four output levels, however, the number of the output levels can be increased by increasing the number of the input voltages. For instance, when V(T0) is selected from m input voltages, according to the selection of (V(T1), V(T2)) from (Va, Vb) and (Vb, Va), a maximum of 2 m voltage levels, obtained by adding/subtracting the potential difference (Vb−Va) to/from the voltage level of V(T0), can be outputted. Although the example in which Va=$V_n$ is shown in FIG. 9 (A), the voltages Va and Vb can be set to any value.

Example 6

Figures 10A, 10B:
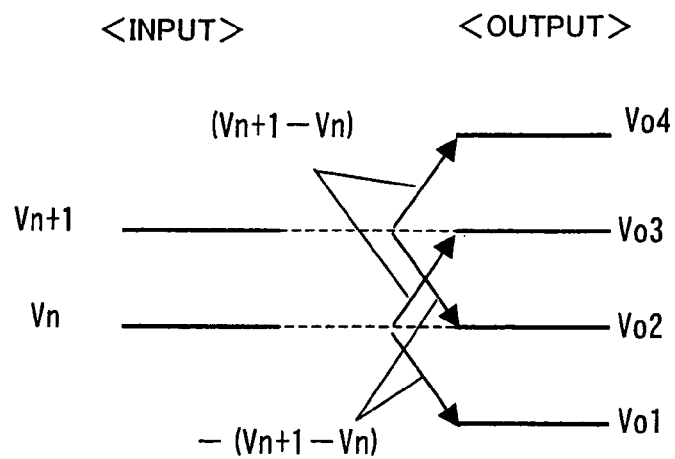
FIGS. 10A and 10B are drawings for explaining the second relationship between three signal voltages and output voltages of the differential amplifier of the present invention.

FIGS. 10A and 10B are drawings for explaining another example in which the differential amplifier of the present invention outputs multi-valued voltages.

FIG. 10A shows the relationship between the input and output levels, and FIG. 10B shows voltage selection states in which four output levels are related to 2-bit digital data (D1, D0). In FIG. 10A, a case where there are two levels of the input voltages, voltages $V_n$, and $V_{n+1}$ (where $V_n$<$V_{n+1}$), is shown. By selectively feeding the voltages $V_n$ and $V_{n+1}$ to the voltages V(T1), V(T2), and V(T0), four levels of the output voltages Vo1 to Vo4 can be outputted.

More concretely, when outputting the voltage Vo1, the input voltages are selected so that (V(T1), V(T2), V(T0))=($V_n$, $V_{n+1}$, $V_n$). Then, from the formula (4), the following results:

$$Vo1 = V_n - (V_{n+1} - V_n) \tag{9}$$

In other words, the voltage Vo1 is obtained by level-shifting the voltage $V_n$ to the low potential side by the amount of the potential difference ($V_{n+1}$−$V_n$).

Further, when outputting the voltage Vo2, the input voltages are selected so that (V(T1), V(T2), V(T0))=($V_n$, $V_{n+1}$, $V_{n+1}$). Then, it results in:

$$Vo2 = V_{n+1} - (V_{n+1} - V_n) \tag{10}$$
$$= V_n.$$

In other words, the voltage Vo2 is obtained by level-shifting the voltage $V_{n+1}$ to the low potential side by the amount of the potential difference ($V_{n+1}$−$V_n$), and has the same potential as that of the voltage $V_n$.

Further, when outputting the voltage Vo3, the input voltages are selected so that (V(T1), V(T2), V(T0))=($V_{n+1}$, $V_n$, $V_n$). Then, it results in:

$$Vo3 = V_n + (V_{n+1} - V_n) \tag{11}$$
$$= V_{n+1}.$$

In other words, the voltage Vo3 is obtained by level-shifting the voltage $V_n$ to the high potential side by the amount of the potential difference ($V_{n+1}$−$V_n$), and has the same potential as that of the voltage $V_{n-1}$.

Further, when outputting the voltage Vo4, the input voltages are selected so that (V(T1), V(T2), V(T0))=($V_{n+1}$, $V_n$, $V_{n+1}$). Then, it results in:

$$Vo4 = V_{n+1} + (V_{n+1} - V_n) \tag{12}$$

In other words, the voltage Vo4 is obtained by level-shifting the voltage $V_{n+1}$ to the high potential side by the amount of the potential difference ($V_{n+1}$−$V_n$).

As described, from the two input voltages, the four levels of voltages can be outputted. Further, in FIGS. 10A and 10B, the differences between the four output levels are the same as the potential difference ($V_{n+1}$−$V_n$) and equal to each other.

Further, as shown in FIG. 10B, the four voltages Vo1 to Vo4 can be selectively outputted by 2-bit digital data (D1, D0).

FIGS. 10A and 10B show the example having four output levels, however, the number of the output levels can be increased by increasing the number of the input voltages. For instance, by selecting the two nearest levels from m input voltages and generating four output levels, 2 m voltage levels can be outputted. Further, by selecting any two levels from m input voltages and generating four output levels, a maximum of $m^2$ voltage levels can be outputted.

Example 7

Figures 11A, 11B:
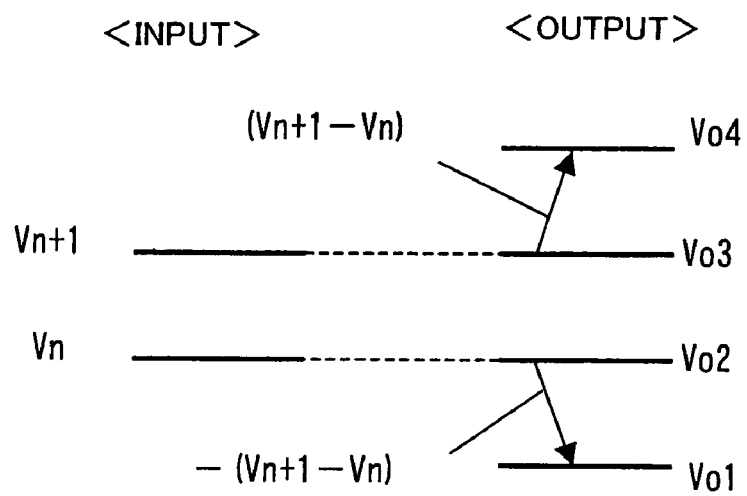

FIGS. 11A and 11B are drawings for explaining yet another example in which the differential amplifier of the present invention outputs multi-valued voltages.

FIG. 11A shows the relationship between the input and output levels, and FIG. 11B shows voltage selection states in which four output levels are related to 2-bit digital data (D1, D0).

FIG. 11A, too, shows a case where there are two levels of the input voltages: voltages $V_n$, and $V_{n+1}$. As shown in FIG. 11B, by selectively feeding the voltages $V_n$ and $V_{n+1}$ to the voltages V(T1), V(T2), and V(T0), four levels of the output voltages Vo1 to Vo4 can be outputted. Note that V(T1)=V(T0) in this example.

At this time, in the cases of Vo1 and Vo4, selection conditions for V(T1), V(T2), and V(T0) are the same as shown in FIG. 10B, and the same output levels are obtained.

In the cases of Vo2 and Vo3, selection conditions for V(T1), V(T2), and V(T0) are different from those shown in FIG. 10B. Therefore the cases where Vo2 and Vo3 are outputted in the operation shown in FIG. 6 will be described.

More concretely, when outputting the voltage Vo2, the input voltages are selected so that (V(T1), V(T2), V(T0))= ($V_n$, $V_n$, $V_n$). Then, it follows:

$$Vo2 = V_n - (V_n - V_n) \quad (13)$$
$$= V_n.$$

In other words, the voltage Vo2 is obtained by level-shifting the voltage $V_n$ by the amount of the potential difference (zero), and has the same potential as that of the voltage $V_n$.

Further, when outputting the voltage Vo3, the input voltages are selected so that (V(T1), V(T2), V(T0))=($V_{n+1}$, $V_{n+1}$, $V_{n+1}$). Then, $$Vo3 = V_{n+1} + (V_{n+1} - V_{n+1}) \quad (14)$$
$$= V_{n+1}.$$

In other words, the voltage Vo3 is obtained by level-shifting the voltage $V_{n+1}$ by the amount of the potential difference (zero), and has the same potential as that of the voltage $V_{n+1}$.

As described, from the two input voltages, the four levels of voltages can be outputted. Note that the differences between the four output levels are the same as the potential difference ($V_{n+1}-V_n$) to be equal interval from one to the next.

Further, as shown in FIG. 11B, the four voltages Vo1 to Vo4 can be selectively outputted by 2-bit digital data (D1, D0).

Further, FIGS. 11A and 11B show the example having four output levels, however, the number of the output levels can be increased by increasing the number of the input voltages. For instance, by selecting the two nearest levels from m input voltages and generating four output levels, 2 m voltage levels can be outputted. Further, by selecting any two levels from m input voltages and generating four output levels, a maximum of $m^2$ voltage levels can be outputted.

Example 8

Figure 12:
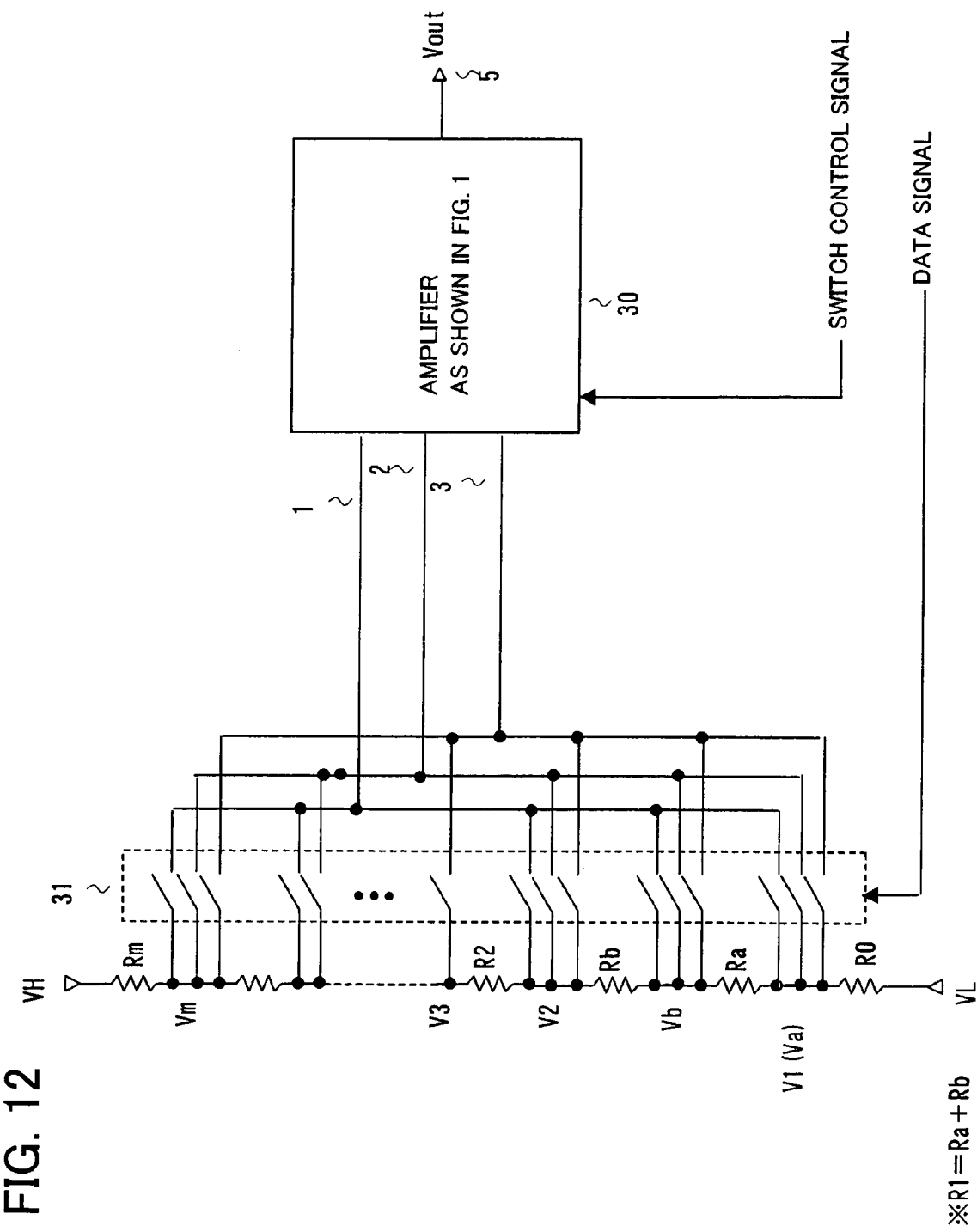
FIG. 12 is a drawing showing the configuration of an example of a digital-to-analog converter of the present invention.

FIG. 12 is a drawing showing the configuration of an example of a digital-to-analog (D/A) converter of the present invention. The digital-to-analog converter of this example is able to realize the relationships between the input and output levels shown in FIGS. 9, 10, and 11 using the differential amplifier of the present invention. In FIG. 12, the differential amplifier described with reference to FIG. 1 is used as a circuit 30 (a multi-level output differential amplifier).

In the digital-to-analog converter shown in FIG. 12, voltages generated at connection terminals between a plurality of resistance elements R0 to Rm connected in series between power supply voltages VL and VH are selected by switches of a switch group 31, the switches being respectively connected between each connection terminal of the resistance elements and input terminals 1, 2 and 3 of the circuit 30 and on/off controlled by a data signal, and outputted to the terminals 1, 2, and 3.

The voltages Va and Vb (where Va=V1) in FIG. 9 are generated at the connection terminals between the resistance elements Ra and Rb (R1=Ra+Rb) as well, respectively selected by three corresponding switches of the switch group 31, and outputted to the terminals 1, 2 and 3. Note that the switch selecting the voltage Vb is not necessary when realizing the relationships between the input and output levels shown in FIGS. 10 and 11.

Further, the circuit 30 receives a switch control signal that on/off controls the switches SW1 and SW2 in FIG. 1.

Further, the switch group 31 receives the input data signal as a selection signal, and voltage levels corresponding to the selection signal are outputted to the terminals 1, 2, and 3 of the differential amplifier.

When the relationship of the input and output levels shown in FIG. 9 is realized by the digital-to-analog converter in FIG. 12, by having the switch group 31 select the voltage Va or Vb according to the input data signal and output it as V(T1) and V(T2) to the terminals 2 and 1 of the circuit 30 (the differential amplifier in FIG. 1) and select m voltages V1 to Vm and output them as V(T0) to the terminal 3 of the circuit 30, a maximum of 2 m voltage levels can be outputted as described with reference to FIG. 9.

Further, when the relationships of the input and output levels shown in FIGS. 10 and 11 are realized, by having the switch group 31 select two voltages from m voltages V1 to Vm according to the input data signal and output them as V(T1), V(T2), and V(T0) to the terminals 2, 1, and 3 of the circuit 30, a maximum of $m^2$ voltage levels can be outputted as described with reference to FIGS. 10 and 11. In the case of FIG. 11, since V(T1)=V(T0), the terminals 2 and 3 of the circuit 30 can be common, and the switches between the terminals 2 and 3 and the connection terminals of the resistance elements R0 to Rm can be common as well.

As described, by appropriately selecting m voltages V1 to Vm or the voltages Va or Vb as the input signals V(T1), V(T2), and V(T0) and supplying them to the terminals 2, 1, and 3 of the circuit 30, a larger number of level voltages than the number of the input voltages can be outputted. Further, the voltages Va and Vb are generated by the resistance element R1 in FIG. 12, however, they can be generated by any resistance element other than the resistance element R1.

The digital-to-analog converter shown in FIG. 12 using the differential amplifier shown in FIG. 1 is capable of obtaining a large number of output voltages with levels different from each other from a small number of input voltages. Therefore, the number of the switches that select the input voltages can be small, reducing the circuit scale, compared to a conventional circuit with the same number of output levels.

Figure 13:
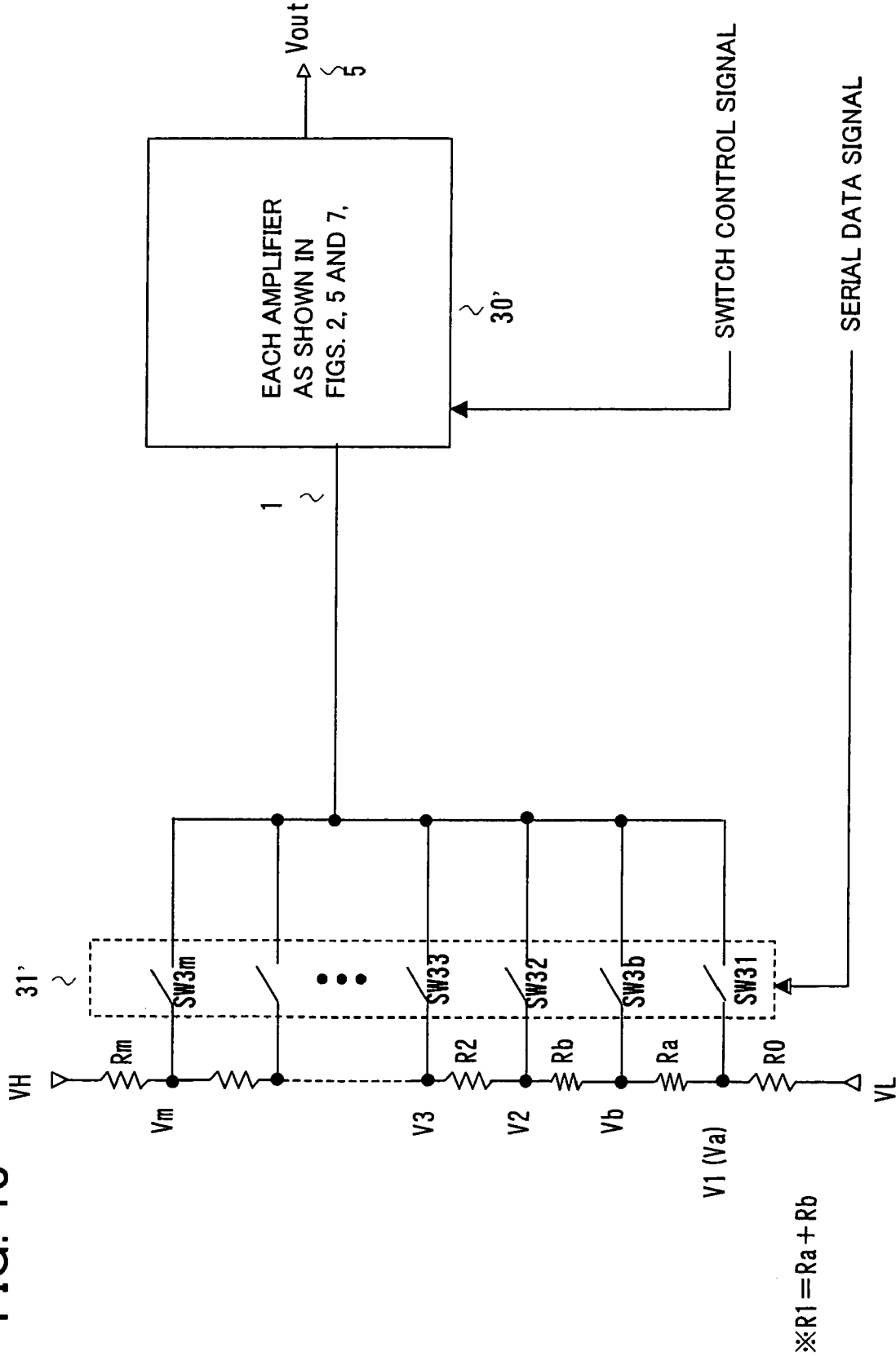
FIG. 13 is a drawing showing the configuration of another example of a digital-to-analog converter of the present invention.

Further, the terminals 1, 2, and 3 may be made common and the voltages may be supplied serially. FIG. 13 is a drawing showing the configuration of such a digital-to-analog converter. In FIG. 13, any of the differential amplifiers described with reference to FIGS. 2, 5, and 7 can be used as a circuit 30'. Switch group 31' selects one of the switches, one after another, according to a serial data signal. A switch control signal on/off controls the switches shown in FIGS. 2, 5, and 7.

According to the serial data signal, the switch group 31' in FIG. 13 selects the same voltages as V(T1), V(T2), and V(T0) selected by the switch group 31 in the digital-to-analog converter shown in FIG. 12, one after another, and outputs them to the terminal 1 of the circuit 30'. Therefore the switch group 31' only needs at least m or (m+1) switches connected between each connection terminal of resistance elements and the input terminal 1 of the circuit 30', reducing the number of the switches greatly.

As described, by appropriately selecting m voltages V1 to Vm or the voltages Va or Vb as the input signals V(T1), V(T2), and V(T0) and serially supplying them to the terminal 1 of the circuit 30', a larger number of level voltages than the number of the input voltages can be outputted.

Example 9

Figure 14:
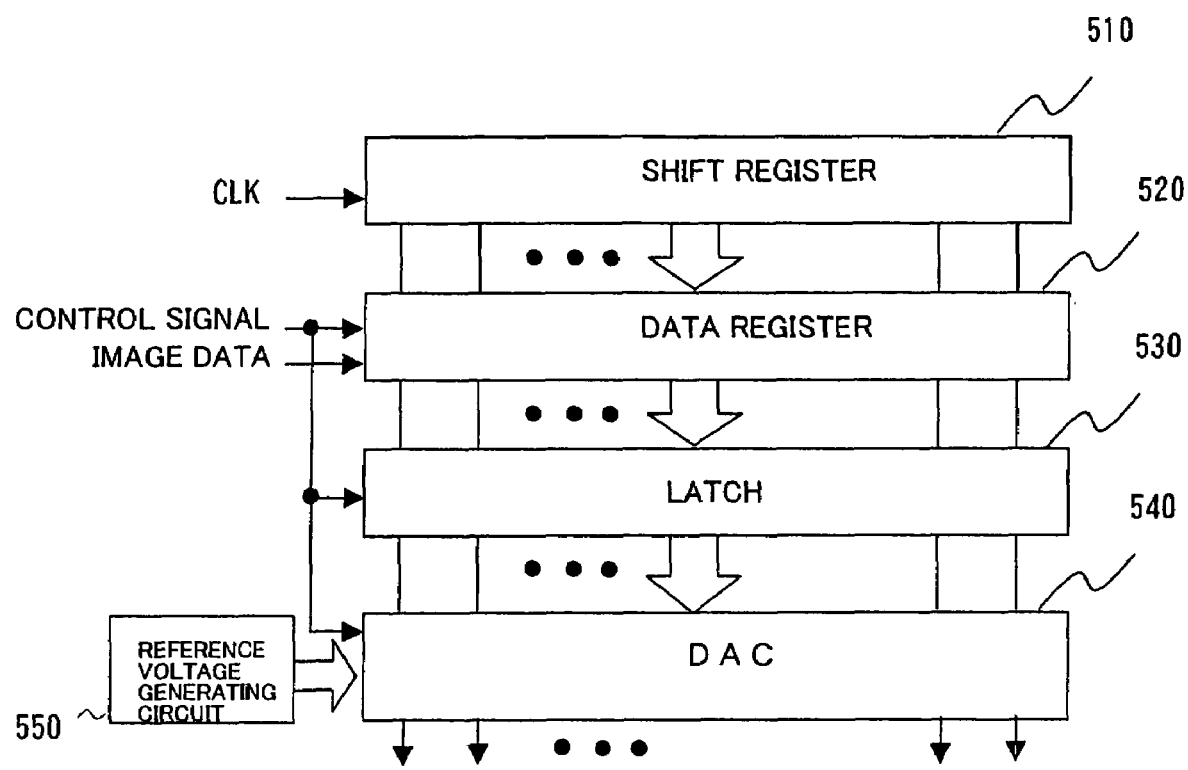
FIG. 14 is a drawing showing the configuration of an example of a data driver of the present invention.
Figure 17:
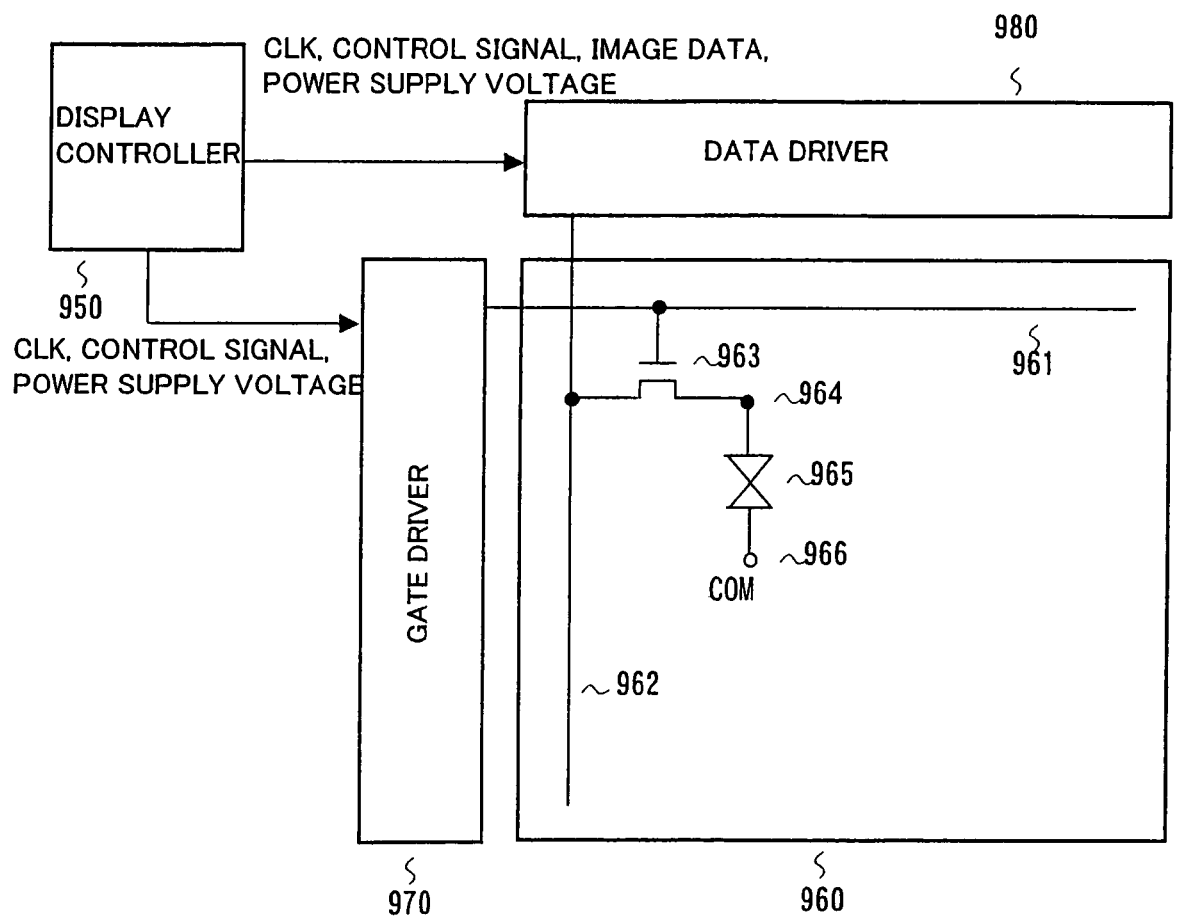
FIG. 17 is a drawing showing a typical configuration of an active matrix liquid crystal display device.
Figure 18:
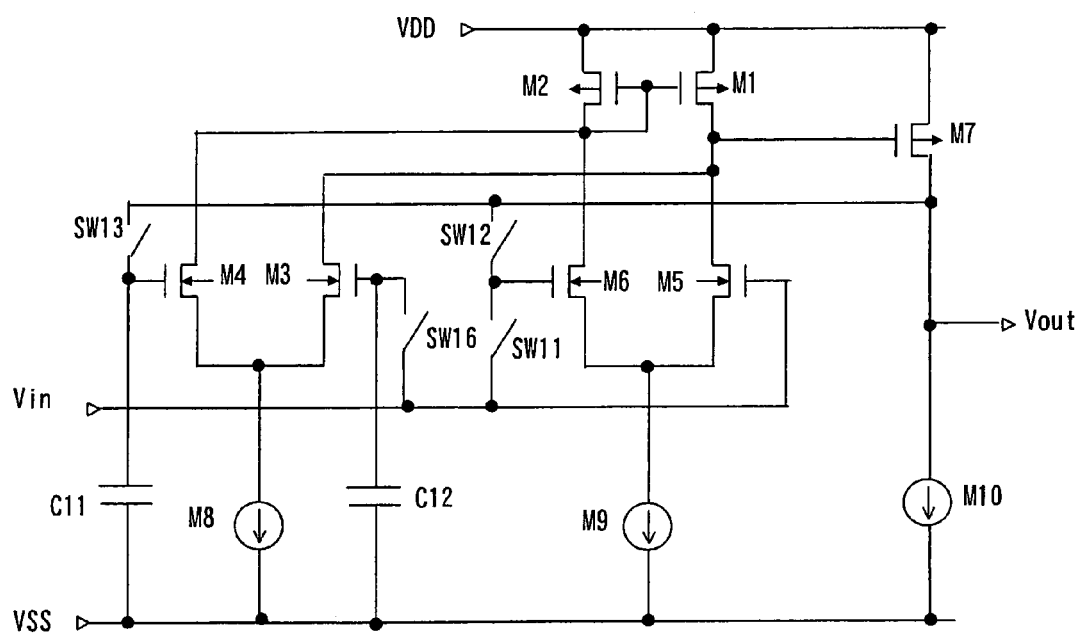
FIG. 18 is a drawing showing the configuration of a differential amplifier based on the concept disclosed in Patent Document 1.
Figure 19:
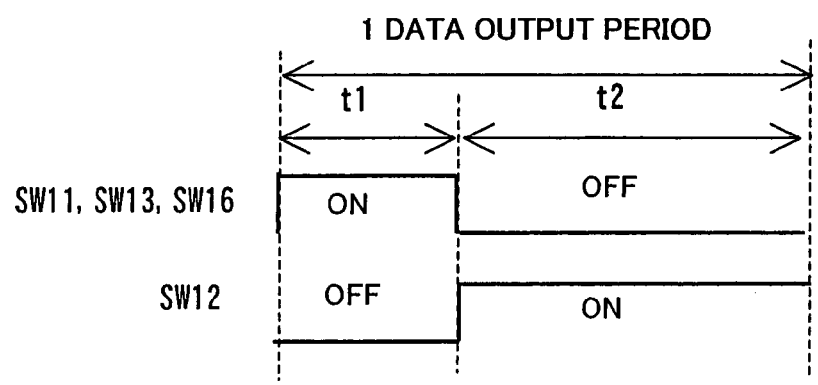
FIG. 19 is a drawing showing the switch control of the circuit shown in FIG. 18.

FIG. 14 is a drawing showing the configuration of a data driver of another example of the present invention. The data driver comprises the digital-to-analog converter shown in FIGS. 12 or 13. For instance, this data driver is used as a data driver (980 in FIG. 17) that drives data lines of a liquid crystal panel according to a video digital signal.

Referring to FIG. 14, this data driver comprises a shift register 510 that transfers a clock CLK by one line, a data register 520 that accepts, for instance, one line of an image data signal according to a clock signal from the shift register 510, a latch circuit 530 that latches one line of an output signal (the image data signal) from the data register 520, and a digital-to-analog converter (DAC) 540 that receives one line of the signal (the image data signal) outputted from the latch circuit 530 as an input data signal, and that outputs an analog voltage corresponding to the input data signal according to a reference voltage from a reference voltage generating circuit 550. The digital-to-analog converter 540 outputs a voltage corresponding to the image data signal from the latch 530 to a data line not shown in the drawing.

The differential amplifier described above may be constituted by not only MOS transistors formed on a semiconductor substrate, but also TFTs (thin film transistors) formed on an insulating substrate. Further, the use of the data driver shown in FIG. 14 is not limited to a data driver of a liquid crystal display device, but it may be used as a data driver of an EL (Electro-Luminescence) display device.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifier comprising:
an input differential stage including first and second differential pairs and a load circuit commonly connected to output pairs of said first and second differential pairs;
an amplifier stage that receives a common output signal from said first and second differential pairs and that charge/discharge-drives an output terminal; and
first and second capacitors respectively connected to first and second inputs of an input pair of said first differential pair; wherein
said first and second inputs of the input pair of said first differential pair receives first and second signals;
said first input of the input pair of said second differential pair receives a third signal; and said second input of the input pair of said second differential pair connects to said output terminal and receives sequentially a feedback signal from the output terminal,
said differential amplifier further comprising
first to third terminals that respectively receive said first to third signals; and
first and second switches on/off controlled by a control signal, which are respectively provided between each connection point of said first and second inputs of the input pair of said first differential pair and said first and second capacitors and said first and second terminals that receive said first and second signals;
said third terminal being connected to said first input of the input pair of said second differential pair.

2. A differential amplifier comprising:
an input differential stage including first and second differential pairs and a load circuit commonly connected to output pairs of said first and second differential pairs;
an amplifier stage that receives a common output signal from said first and second differential pairs and that charge/discharge-drives an output terminal; and
first and second capacitors respectively connected to first and second inputs of an input pair of said first differential pair; wherein
said first and second inputs of the input pair of said first differential pair receives first and second signals;
said first input of the input pair of said second differential pair receives a third signal; and said second input of the input pair of said second differential pair connects to said output terminal and receives sequentially a feedback signal from the output terminal, said differential amplifier
further comprising:
a terminal that receives said first to third signals in a predetermined order, and
first and second switches respectively connected between said terminal and said first and second inputs of the input pair of said first differential pair
wherein said first and second inputs of the input pair of said second differential pair are respectively connected to said terminal and said output terminal.

3. The differential amplifier as defined in claim 1 wherein a voltage obtained by adding a differential voltage between said first and second signals to said third signal is outputted from said output terminal.

4. A differential amplifier comprising:
first to third input terminals and an output terminal;
first and second differential pairs having output pairs commonly connected to a load circuit and driven by respective corresponding current sources;
an amplifier stage having an input end connected to at least one of common connection points between said load circuit and the output pairs of said first and second differential pairs, and an output end connected to said output terminal; wherein first and second inputs of an input pair of said second differential pair receives a signal from said third input terminal and a feedback signal from said output terminal;

first and second switches respectively connected between first and second inputs of an input pair of said first differential pair and said first and second input terminals; and first and second capacitors respectively connected between each connection point of said first and second inputs of the input pair of said first differential pair and said first and second switches and a reference voltage terminal.

5. A differential amplifier comprising:

an input terminal and an output terminal;

first and second differential pairs having output pairs commonly connected to a load circuit and driven by respective corresponding current sources;

an amplifier stage having an input end connected to at least one of common connection points of said load circuit and the output pairs of said first and second differential pairs, and an output end connected to said output terminal; wherein said first input of the input pair of said second differential pair receives a signal from said input terminal;

said second input of the input pair of said second differential pair connects to said output terminal and receives sequentially a feedback signal from the output terminal first and second switches respectively connected between said input terminal and first and second inputs of an input pair of said first differential pair; and first and second capacitors respectively connected between each connection point of said first and second inputs of the input pair of said first differential pair and said first and second switches and a reference voltage terminal wherein controlling is performed as follows:

during a first period, said first and second switches are both turned on and a first signal is supplied to said input terminal;

during a second period following said first period, one of said first and second switches is turned on while the other is off and a second signal is supplied to said input terminal; and during a third period following said second period, said first and second switches are both turned off and a third signal is supplied to said input terminal.

6. A differential amplifier comprising:

an input terminal and an output terminal;

first and second differential pairs having output pairs commonly connected to a load circuit and driven by respective corresponding current sources;

an amplifier stage having an input end connected to at least one of common connection points of said load circuit and the output pairs of said first and second differential pairs, and an output end connected to said output terminal; wherein said first input of the input pair of said second differential pair receives a signal from said input terminal;

said second input of the input pair of said second differential pair connects to said output terminal and receives sequentially a feedback signal from the output terminal first and second switches respectively connected between said input terminal and first and second inputs of an input pair of said first differential pair;

first and second capacitors respectively connected between each connection point of said first and second inputs of the input pair of said first differential pair and said first and second switches and a reference voltage terminal; and a third switch connected between said output terminal and a connection point of said first input of the input pair of said first differential pair, said first switch, and said first capacitor.

7. The differential amplifier as defined in claim 6 further comprising a fourth switch, which is normally turned oft connected between said output terminal and a connection point of said second input of the input pair of said first differential pair, said second switch and said second capacitor.

8. The differential amplifier as defined in claim 6 wherein controlling is performed as follows:

during a first period, said second and third switches are both turned on while said first switch is off and a first signal is supplied to said input terminal;

during a second period following said first period, said third switch is turned off while said first and second switches are on, and said first signal is supplied to said input terminal;

during a third period following said second period, said third switch is turned off while one of said first and second switches is on and the other is oft and a second signal is supplied to said input terminal; and during a fourth period following said third period, said first to third switches are turned off and a third signal is supplied to said input terminal.

9. A differential amplifier comprising:

an input terminal and an output terminal;

first and second differential pairs having output pairs commonly connected to a load circuit and driven by respective corresponding current sources;

an amplifier stage having an input end connected to at least one of common connection points of said load circuit and the output pairs of said first and second differential pairs, and an output end connected to said output terminal; wherein said first input of the input pair of said second differential pair receives a signal from said input terminal;

said second input of the input pair of said second differential pair connects to said output terminal and receives sequentially a feedback signal from the output terminal first and second switches respectively connected between said input terminal and first and second inputs of an input pair of said first differential pair;

first and second capacitors respectively connected between each connection point of said first and second inputs of the input pair of said first differential pair and said first and second switches and a reference voltage terminal;

a third switch connected between said output terminal and a connection point of said first input of the input pair of said first differential pair, said first switch, and said first capacitor;

a fifth switch connected between a connection point of said second input of the input pair of said first differential pair and said second switch and said second capacitor; and a fourth switch connected between said output terminal and a connection point of said second capacitor and said fifth switch.

10. The differential amplifier as defined in claim 9 further comprising a sixth switch, which is normally turned on, connected between a connection point of said first input of the input pair of said first differential pair and said first switch and a connection point of said first capacitor and said third switch.

11. The differential amplifier as defined in claim 9 wherein controlling is performed as follows:

during a first period, said first switch is turned off, said second, third, and fourth switches are on, said fifth switch is off and a first signal is supplied to said input terminal;

during a second period following said first period, said first, second and fifth switches are turned on while said third and fourth switches are both off and said first signal is supplied to said input terminal;

during a third period following said second period, said third and fourth switches are turned off, said fifth switch is on, one of said first and second switches is on while the other is off and a second signal is supplied to said input terminal; and during a fourth period following said third period, said fifth switch is turned on while said first, second, third, and fourth switches are off and said third signal is supplied to said input terminal.

12. The differential amplifier as defined in claim 1 wherein said third signal is the same signal as said first signal or said second signal.

13. A digital-to-analog converter circuit comprising:

a reference voltage generating circuit that generates a plurality of reference voltages having different levels from one another;

a selection circuit that selects reference voltages from said reference voltage generating circuit as said first, second and third signals according to an input digital signal; and the differential amplifier, as defined in claim 2, that receives said first, second, and third signals outputted from said selection circuit at said first to third terminals respectively.

14. A digital-to-analog converter circuit comprising:

a reference voltage generating circuit that generates a plurality of reference voltages having different levels from one another;

a selection circuit that selects reference voltages from said reference voltage generating circuit as said first, second and third signals according to an input digital signal; and the differential amplifier, as defined in claim 5, that receives said first, second, and third signals outputted from said selection circuit at said first to third terminals respectively.

15. A digital-to-analog converter circuit comprising:

a reference voltage generating circuit that generates a plurality of reference voltages having different levels from one another;

a selection circuit that selects reference voltages from said reference voltage generating circuit as said first, second and third signals according to an input digital signal; and the differential amplifier, as defined in claim 3, that successively receives said first, second, and third signals outputted from said selection circuit at said input terminal.

16. A digital-to-analog converter circuit comprising:

a reference voltage generating circuit that generates a plurality of reference voltages having different levels from one another;

a selection circuit that selects reference voltages from said reference voltage generating circuit as said first, second and third signals according to an input digital signal; and the differential amplifier, as defined in claim 6, that successively receives said first, second, and third signals outputted from said selection circuit at said input terminal.

17. A data driver comprising the digital-to-analog converter circuit as defined in claim 13 and driving a data line according to an image data signal supplied.

18. A display device comprising the data driver as defined in claim 17.

19. The differential amplifier as defined in claim 2 wherein a voltage obtained by adding a differential voltage between said first and second signals to said third signal is outputted from said output terminal.

20. The differential amplifier as defined in claim 2 wherein said third signal is the same signal as said first signal or said second signal.

* * * * *